(12) United States Patent
Tanizawa

(10) Patent No.: US 7,777,565 B2
(45) Date of Patent: Aug. 17, 2010

(54) DIFFERENTIAL AMPLIFICATION CIRCUIT AND MANUFACTURING METHOD THEREOF

(75) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 53 days.

(21) Appl. No.: 12/285,706

(22) Filed: Oct. 14, 2008

(65) Prior Publication Data

US 2009/0096524 A1    Apr. 16, 2009

(30) Foreign Application Priority Data

Oct. 15, 2007    (JP)    ............................. 2007-268133

(51) Int. Cl.
H03F 3/45    (2006.01)
H03G 3/20    (2006.01)

(52) U.S. Cl. .......................................... 330/69; 330/86

(58) Field of Classification Search ...................... 330/2, 330/9, 69, 86
See application file for complete search history.

(56) References Cited

U.S. PATENT DOCUMENTS

| 5,142,238 | A | 8/1992 | White |
| 6,268,734 | B1 * | 7/2001 | Knapton ...................... 324/537 |
| 7,605,659 | B2 * | 10/2009 | Hughes ....................... 330/282 |

2007/0229120 A1    10/2007    Okajima et al.

FOREIGN PATENT DOCUMENTS

| JP | A-61-177010 | 8/1986 |
| JP | A-61-287308 | 12/1986 |
| JP | U-S63-35310 | 3/1988 |
| JP | A-H5-129848 | 5/1993 |
| JP | A-5-505072 | 7/1993 |
| JP | A-06-152258 | 5/1994 |
| JP | A-H10-002820 | 1/1998 |
| JP | A-2001-298337 | 10/2001 |
| JP | A-2006-064627 | 3/2006 |
| JP | A-2007-124498 | 5/2007 |
| WO | WO 91/07815 | 5/1991 |

OTHER PUBLICATIONS

Notice of Reason for Refusal issued from the Japanese Patent Office mailed on Aug. 18, 2009 in the corresponding Japanese patent application No. 2007-268133 (with English translation thereof).
Notice of Reason for Refusal issued from the Japanese Patent Office mailed on Mar. 2, 2010 in the corresponding Japanese patent application No. 2007-268133 (with English translation thereof).

* cited by examiner

*Primary Examiner*—Steven J Mottola
(74) *Attorney, Agent, or Firm*—Posz Law Group, PLC

(57) ABSTRACT

A differential amplification circuit and a method corrects an offset voltage derived from a variance in resistances. With first and second input terminals brought to the same potential and set to a potential different from a reference potential, the resistance value of resistors is adjusted so that an output potential and the reference potential will be substantially equal to each other.

10 Claims, 22 Drawing Sheets

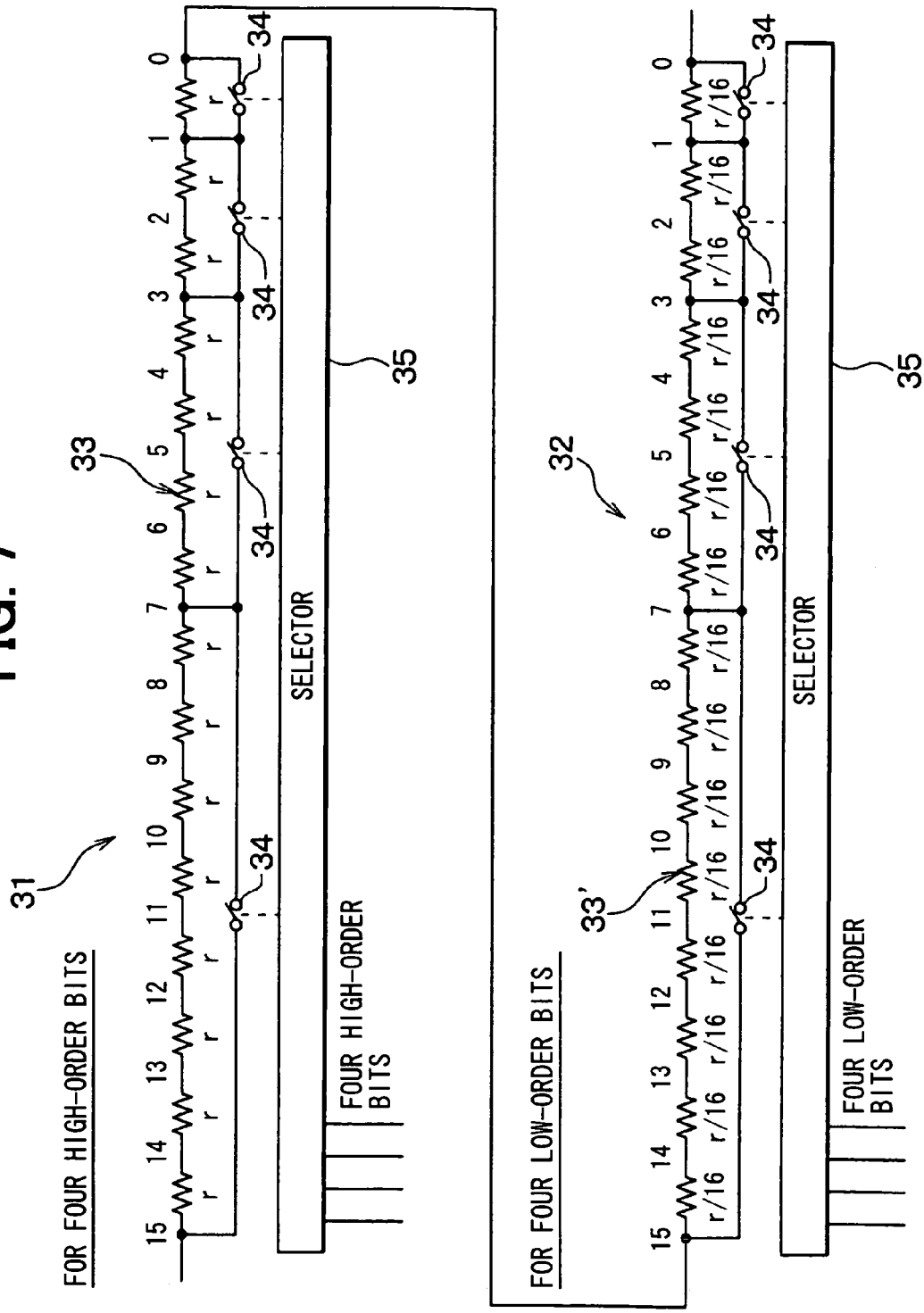

DIFFERENTIAL AMPLIFICATION CIRCUIT AND MANUFACTURING METHOD THEREOF

CROSS REFERENCE TO RELATED APPLICATIONS

The present application is based on and claims priority to Japanese Patent Applications No. 2007 268133 filed Oct. 15, 2007, the entire contents of which are incorporated herein by reference.

BACKGROUND OF THE INVENTION

1. Field of the Invention

The invention relates to a differential amplification circuit compensating for an offset voltage from a variance in resistances, and a manufacturing method.

2. Description of the Related Art

In the past, a current detection device including a shunt resistor that detects a current flowing into a battery, an amplifier that amplifies a voltage across the terminals of the shunt resistor, and a switch that is used to strap two input terminals of the amplifier so as to temporary bring an input voltage to a zero or near zero value as been proposed. Refer, for example, to JP-A-2006-64627 where such an amplifier encompassing a differential amplification circuit is described.

In a prior art current detection device, the shunt resistor has the terminals thereof temporarily strapped by the switch in order to measure an offset voltage of the amplifier, and the offset voltage is then subtracted and eliminated from a remaining battery capacity.

In recent years, sensors for detecting a battery voltage, a battery current, or a temperature have been mounted in a vehicle for the purpose of sensing the state of an automobile battery. A current sensor has come to be used to detect a current and the detection methods include a magnetic detection method using a Hall element, and a resistive method. A resistive current sensor uses a differential amplification circuit to detect a potential difference across the terminals of a detection resistor, and has the advantage that the detection resistive element itself is, in principle, devoid of an offset and that the temperature dependency of sensitivity can be reduced by employing a resistor whose temperature coefficient is small.

However, when a device such as the device described in JP-A-2006-64627 is mounted in a vehicle, since an automobile battery current ranges from about 500 A to at most about 1000 A, and since a shunt resistor has to offer a resistance of about 0.1 mΩ, a resistance of the switch to be used to strap the terminals of the shunt resistor is required to be ¹⁄₁₀₀ or less of the resistance of the shunt resistor, that is, about 1μΩ or less for bringing an error to 1% or less. The adoption of a switch satisfying the condition is unfeasible. However, if a correction means is not adopted, various microscopic resistances of wirings exist with the sensors attached. Consequently, the potential at the entire shunt resistor that is the detection resistor fluctuates due to a potential drop. Experimental study has revealed that, eventually, an error which is potential-dependent and derived from a variance in resistances in the differential amplification circuit poses a problem as will be described herein below with reference to FIG. 24.

As shown, a load 61 and an electronic control unit (ECU) 62 are connected to an automobile battery 60. The load 61 is connected to a body ground 63. The body ground 63 is connected to the battery 60 via various wiring resistors, for example, a fastening bolt contact resistor 64, a harness resistor 65, a fastening bolt contact resistor 66, a shunt resistor 67 for detecting a battery current, and a battery post contact resistor 68.

A differential amplification circuit 69 for detecting a battery current is connected to the terminals of the shunt resistor 67, and a differential amplification circuit 70 for detecting a battery voltage is connected to the terminals of the battery 60. The ECU 62 directly or indirectly monitors the battery current and battery voltage using the outputs of the differential amplification circuits 69 and 70. Moreover, the grounds of the differential amplification circuits 69 and 70, or more particularly, the grounds of operational amplifiers included in the differential amplification circuits 69 and 70 respectively are connected to the body ground 63 that is used in common with the ECU 62 and load 61.

However, as shown in FIG. 24, between the body ground 63 and battery 60, the wiring resistors including the fastening bolt contact resistor 64 exists in addition to the shunt resistor 67. Consequently, when a discharge current flows from the body ground 63 to the shunt resistor 67, a voltage drop of several volts occurs in the range from the body ground 63 to the shunt resistor 67 due to the fastening bolt contact resistor 64 and others. In contrast, a potential difference across the terminals of the shunt resistor 67 which is handled as a current detection signal is 100 mV or less.

Namely, the potential at the terminal of the shunt resistor 67 on the side of the body ground 63 is ideally identical to the ground potential at the body ground 63. In reality, since the wiring resistors including the fastening bolt contact resistor 64 cannot be ignored, the potentials at the terminals of the shunt resistor 67 largely vary because of the wiring resistors.

On the other hand, the resistance values of the resistors in the differential amplification circuit 69 vary with respect to design values due to factors such as the precision of a manufacturing apparatus during manufacture of the differential amplification circuit 69. An offset voltage derived from the variance in resistances therefore occurs in the differential amplification circuit 69.

Consequently, when the differential amplification circuit 69 is incorporated in a system shown in FIG. 24, the overall potential at the shunt resistor 67 fluctuates due to the adverse effect of the wiring resistors. Accordingly, the offset voltage of the differential amplification circuit 69 fluctuates. In other words, a potential-dependent error derived from the variance in resistances in the differential amplification circuit 69 occurs in the differential amplification circuit 69. The error causes degradation in the precision of the differential amplification circuit 69. The same applies to the differential amplification circuit 70 for detecting a battery voltage.

SUMMARY OF THE INVENTION

It has been revealed during experimentation that the above described offset voltage is dependent on an input voltage to be fed to the differential amplification circuit 69. Thus, the above described error can be disadvantageously compounded.

The present invention addresses the foregoing and other issues, and is intended to provide a differential amplification circuit capable of compensating an offset voltage thereof derived from a variance in resistances, and a manufacturing method thereof.

An offset voltage of an operational amplifier derived from a variance in a property of transistors included in a differential input stage of the operational amplifier is widely known. However, in the present application, unless otherwise noted, what is simply called an offset voltage refers to an offset voltage derived from a variance in resistances.

In order to accomplish the above object, according to a first feature of the invention, a differential amplifier circuit includes an operational amplifier having a potential at an output terminal thereof handled as an output potential, a first resistor connected between a first input terminal and brought to a first input potential and an inverting input terminal of the operational amplifier and that functions as an input resistor, a second resistor connected between a second input terminal brought to a second input potential and a non-inverting input terminal of the operational amplifier and that functions as an input resistor, a third resistor connected between the inverting input terminal of the operational amplifier and the output terminal of the operational amplifier, a fourth resistor connected between the non-inverting input terminal of the operational amplifier and a reference potential point. With the first and second input terminals brought to the same potential and, with the potentials at the first and second input terminals set to a potential different from the reference potential, the resistance value of any of a first, a second, a third, and a fourth resistor is adjusted so that the output potential and the reference potential will be substantially equal to each other.

Consequently, the offset voltage itself can be corrected so as not to depend on the first and second input potentials which are inputted to the differential amplification circuit. In other words, even when the mean potential between the first and second input potentials varies greatly, the adverse effect of the offset voltage can be nullified.

Consequently, when the differential amplification circuit is incorporated in the system shown in FIG. 24, even if the potentials at the terminals of the shunt resistor 67 fluctuate due to the wiring resistors, the offset voltage of the differential amplification circuit will not fluctuate along with the fluctuation in the potentials. In other words, since the resistance value of any of the resistors 1 to 4 is adjusted so that the offset voltage will be corrected, occurrence of a potential-dependent error derived from a variance in resistances in the differential amplification circuit can be prevented. Even when the voltage across the terminals of the battery 60 is measured, occurrence of a potential-dependent error can be prevented.

As for adjustment of the resistances of the resistors 1 to 4, the adjustment should merely be performed once during manufacture of the differential amplification circuit.

Assuming that R1 denotes the resistance value of the first resistor 1, R2 denotes the resistance value of the second resistor 2, R3 denotes the resistance value of the third resistor 3, and R4 denotes the resistance value of the fourth resistor 4, the resistance value of any of the first, second, third, and fourth resistors 1, 2, 3, and 4 is adjusted so that a condition of R1·R4−R2·R3=0 will be satisfied.

A resistance varying means 20, 30, 40, 40', or 50 may be included for adjusting the resistance value of any of the first, second, third, and fourth resistors 1, 2, 3, and 4.

According to a second feature of the invention, a differential amplification circuit includes an operational amplifier 10 having a potential at an output terminal thereof handled as an output potential, a first resistor 1 connected between a first input terminal 11 brought to a first input potential and an inverting input terminal of the operational amplifier 10 and that functions as an input resistor, a second resistor 2 connected between a second input terminal 12 brought to a second input potential and the non-inverting terminal of the operational amplifier 10 and that functions as an input resistor, a third resistor 3 connected to the inverting input terminal of the operational amplifier 10, a fourth resistor 4 connected to the non-inverting input terminal of the operational amplifier 10, a fifth resistor 5 connected in series with the third resistor 3 between the third resistor 3 and the output terminal of the operational amplifier 10; a sixth resistor 6 connected in series with the fourth resistor 4 between the fourth resistor 4 and a reference potential point; and a seventh resistor 7 connected between the junction of the third and fifth resistors 3 and 5 and the junction of the fourth and sixth resistors 4 and 6. Herein, with the first and second input terminals 11 and 12 brought to the same potential and with the potentials at the first and second input terminals 11 and 12 set to a potential different from the reference potential, the resistance value of any of the first, second, third, fourth, fifth, and sixth resistors 1, 2, 3, 4, 5, and 6 is adjusted so that the output potential and reference potential will be substantially equal to each other.

Similarly to the differential amplification circuit including the first to fourth resistors 1 to 4, the differential amplification circuit including the first to seventh resistors 1 to 7 has the offset voltage thereof corrected by adjusting the resistance value.

Assuming that R1 denotes the resistance value of the first resistor 1, R2 denotes the resistance value of the second resistor 2, R3 denotes the resistance value of the third resistor 43, R4 denotes the resistance value of the fourth resistor 4, R5 denotes the resistance value of the fifth resistor 5, and R6 denotes the resistance value of the sixth resistor 6, the resistance value of any of the first, second, third, fourth, fifth, and sixth resistor 1, 2, 3, 4, 5, and 6 may be adjusted so that a condition of R1·R4−R2·R3=0 and a condition of R1·R6−R2·R5=0 will be satisfied.

A resistance varying means 20, 30, 40, 40', or 50 may be included for adjusting the resistance value of any of the first, second, third, fourth, fifth, and sixth resistors 1, 2, 3, 4, 5, and 6.

As the resistance varying means 30, a means including multiple resistors 33 or 33', pieces of switch means 34 that selectively strap arbitrary ones of the multiple resistors 33 or 33', and a selector 35 for switching the pieces of switch means 34 according to an externally inputted digital signal may be adopted.

Consequently, since the resistance varying means 20, 30, 40, 40'; or 50 can be realized with a fixed resistor devoid of a moving element included in a potentiometer or the like, the differential amplification circuit can be readily incorporated in an IC. Moreover, since the resistance varying means 20, 30, 40, 40', or 50 is realized with a fixed resistor and devoid of a sliding element, the reliability of the resistance varying means 20, 30, 40, 40', or 50 can be improved. Moreover, the employment of a digital signal permits electrical high-speed adjustment. Eventually, the mass-productivity of the differential amplification circuit can be improved.

As the resistance varying means 40, a means including multiple resistors 41 and an analog multiplexer 42 that determines a connection form of the multiple resistors 41 according to an externally inputted digital signal may be adopted. Similarly, as the resistance varying means 40', a means including multiple resistors 41' and an analog multiplexer 42' that determines a connection form of the multiple resistors 41' according to an externally inputted digital signal may be adopted.

When a configuration employing the analog multiplexer 42 or 42' is adopted as that of the resistance varying means 20, 30, 40, 40', or 50 and the pieces of switch means 34 are connected to the inverting input terminal and non-inverting input terminal of the operational amplifier 10 capable of ignoring a flowing current, a potential drop caused by a resistance introduced by the pieces of switch means 34 can be ignored. Consequently, highly precise adjustment can be achieved.

Pieces of resistance varying means 40 and 40' can be connected to the inverting input terminal of the operational amplifier 10 and the non-inverting input terminal thereof respectively. The resolution of the resistance varying means 40 connected to the inverting input terminal and the resolution of the resistance varying means 40' connected to the non-inverting input terminal may be made different from each other.

What is referred to as a resolution is the smallest changeable step by which a differential amplification circuit output can be changed by the resistance varying means 40 or 40'. When the configuration including the two pieces of resistance varying means 40 and 40' is adopted, the number of adjustment steps for a resistance value permitted in the differential amplification circuit is a product of the number of steps, which is supported by one of the pieces of resistance varying means, by the number of steps supported by the other resistance varying means. Consequently, the differential amplification circuit can be constructed using a small number of resistors and a small number of switches.

The configuration of a differential amplification circuit has been described so far. The same applies to a manufacturing method for the differential amplification circuit. For example, with the first and second input terminals 11 and 12 brought to the same potential and with the potentials at the first and second input terminals 11 and 12 set to a potential different from the reference potential, the resistance value of any of the first, second, third, and fourth resistors 1, 2, 3, and 4 is adjusted so that the output potential and reference potential will be substantially equal to each other. Consequently, a differential amplification circuit having an offset voltage thereof corrected can be manufactured.

The reference numerals assigned to the pieces of means are written in parentheses in order to indicate the relationships of correspondence with concrete pieces of means included in embodiments to be described later.

BRIEF DESCRIPTION OF THE DRAWINGS

Other objects, features and characteristics of the invention will be appreciated and become apparent to those of ordinary skill in the art and all of which form a part of the present application. In the drawings:

FIG. 7 is a concrete circuit diagram illustrating the digital variable resistor shown in FIG. 6:

DETAILED DESCRIPTION OF THE EXEMPLARY EMBODIMENTS

Figure 1:
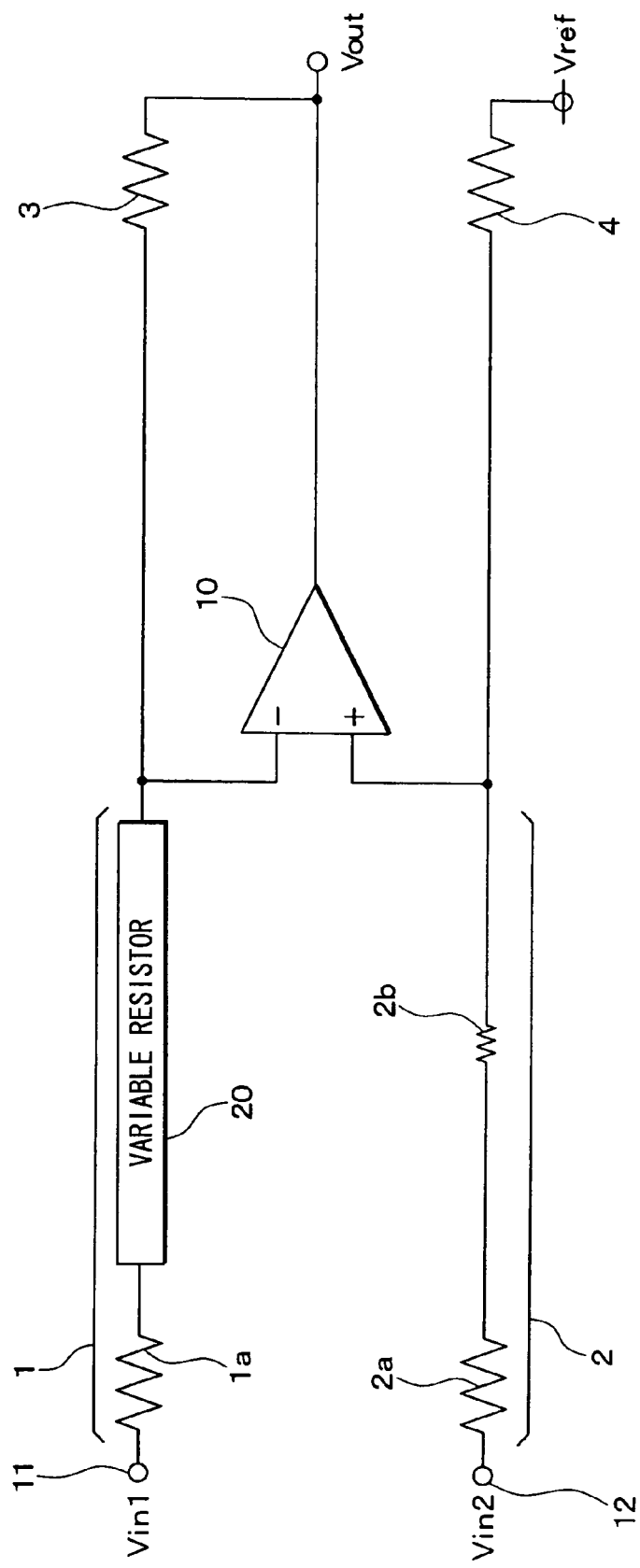
FIG. 1 is a circuit diagram illustrating a differential amplification circuit in accordance with a first embodiment.

Referring to the drawings, embodiments of the invention will be described below. In the embodiments to be described below, the same reference numerals will be assigned to identical or equivalent components.

First Embodiment

The first embodiment of the invention will be described below with reference to the drawings.

FIG. 1 is a circuit diagram of a differential amplification circuit in accordance with a first embodiment. As shown in the drawing, the difference amplification circuit includes a first resistor 1, a second resistor 2, a third resistor 3, a fourth resistor 4, and an operational amplifier 10.

The first resistor 1 is connected between a first input terminal 11 brought to a first input potential Vin1 and an inverting input terminal of the operational amplifier 10, and functions as an input resistor. The second resistor 2 is connected between a second input terminal 12 brought to a second input potential Vin2 and a non-inverting input terminal of the operational amplifier 10, and functions as an input resistor. The third resistor 3 is connected between the inverting input terminal of the operational amplifier 10 and the output terminal of the operational amplifier 10. The fourth resistor 4 is connected between the non-inverting input terminal of the operational amplifier 10 and a reference potential point Vref.

The potential at the output terminal of the operational amplifier 10 is handled as an output potential Vout. Preferably, an autozero amplifier or a chopper-stabilized amplifier having the capability for correcting an offset voltage thereof should be adopted as the operational amplifier 10.

What is referred to as the resistance value of the first resistor 1 is a substantial resistance value introduced within a range from the first input terminal 11 to the inverting input terminal of the operational amplifier 10. When the first resistor 1 is formed with multiple resistors, the resistance value of the first resistor 1 refers to a synthetic resistance value of the resistance values of the multiple resistors. Moreover, what is referred to as the resistance value of the second resistor 2 is a substantial resistance value introduced within a range from the second input terminal 12 to the non-inverting input terminal of the operational amplifier 10. Likewise, what is referred to as the resistance value of the third resistor 3 is a substantially resistance value introduced within a range from the inverting input terminal of the operational amplifier 10 to the output potential point Vout. What is referred to as the resistance value of the fourth resistor 4 is a substantial resistance value introduced within a range from the non-inverting input terminal of the operational amplifier 10 to the reference potential point Vref.

Figure 2:
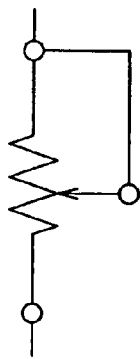
FIG. 2 is a circuit diagram illustrating a variable resistor shown in FIG. 1.

The first resistor 1 has a fixed resistor 1a and a variable resistor 20 connected in series with each other. The fixed resistor 1a is a resistor whose resistance value is constant. FIG. 2 is a circuit diagram of the variable resistor 20. A potentiometer including a moving element can be adopted as the variable resistor 20. The variable resistor 20 can function as a resistance varying means.

A variable range for the first resistor 1 is preferably a range of ±21% or less of the maximum resistance value of the first resistor 1. Assuming that the first resistor 1 is formed with the worst pair of resistors, that is, locally procurable resistors of standard products ensuring 5% precision, when a condition of $R1 \cdot R4 - R2 \cdot R3 = 0$ should be satisfied, an adjustable resistance R1 is calculated as approximately 1.16 according to $R1 = 1.05 \times 1.05/0.95$. Since the first resistor 1 itself is thought to cause an error at 5%, the variable range (adjustable width) should be the range of ±21% of the maximum resistance value of the first resistor 1. Likewise, when the error caused by the first resistor 1 is rated at 3%, the variable range should be a range of ±13% or less. When the error is rated at 1%, the variable range should be a range of ±6% or less.

Moreover, the second resistor 2 has a fixed resistor 2a and a dummy resistor 2b connected in series with each other. The fixed resistor 2a is a resistor whose resistance value is constant. The dummy resistor 2b is a resistor whose resistance value is a half of the maximum resistance value of the variable resistor 20. Since the fixed resistor 2a and dummy resistor 2b are included in association with the fixed resistor 1a of the first resistor 1 and the variable resistor 20 thereof, the symmetry between the first and second resistors 1 and 2 is improved. Incidentally, the second resistor 2 may have the fixed resistor 2a and dummy resistor 2b integrated into one resistor.

Next, a method of adjusting the resistance value of the variable resistor 20 included in the differential amplification circuit shown in FIG. 1 will be described below. In the differential amplification circuit shown in FIG. 1, the output potential Vout is expressed as follows (EQ 1).

$$Vout = Vin1 \cdot A - Vin2 \cdot B + Vref \cdot C \qquad (EQ\ 1)$$

Assuming that R1 denotes the resistance value of the first resistor 1, R2 denotes the resistance value of the second resistor 2, R3 denotes the resistance value of the third resistor 3, and R4 denotes the resistance value of the fourth resistor 4, the following relations: $A = -(R3/R1)$, $B = -(R4/R1) \cdot \{(R1+R3)/(R2+R4)\}$, and $C = (R2/R1) \cdot \{(R1+R3)/(R2+R4)\}$ are established.

For realizing a differential amplification circuit whose output potential Vout does not depend on the first and second input potentials Vin1 and Vin2, that is, an ideal differential amplification circuit, the output potential Vout can be a potential expressed as follows (EQ 2).

$$Vout = K1 \cdot (Vin1 - Vin2) + K2 \qquad (EQ\ 2)$$

where K1 and K2 denote constants.

A condition under which EQ 1 and EQ 2 become equal to each other is when the coefficient A equals the coefficient B, that is, when the relation $-(R3/R1) = -(R4/R1) \cdot \{(R1+R3)/(R2+R4)\}$ is established, which can be simplified as follows (EQ 3).

$$R1 \cdot R4 = R2 \cdot R3 \qquad (EQ\ 3)$$

The condition under which the output potential does not depend on the first and second input potentials Vin1 and Vin2 can be expressed by EQ 3. However, the resistance value cannot be easily adjusted according to the EQ 3. When EQ 3 is applied to EQ 1, C=1 is obtained and the following expression is found (EQ 4).

$$Vout = (Vin1 - Vin2) \cdot B + Vref \qquad (EQ\ 4)$$

The condition under which the output potential does not depend on the first and second input potentials Vin1 and Vin2 can be expressed by EQ 4. Consequently, the resistance value of the variable resistor 20 should be adjusted once according to a procedure described below.

To begin with, the differential amplification circuit shown in FIG. 1 is manufactured. The differential amplification circuit is incorporated in an integrated circuit (IC) on, for example, a semiconductor substrate according to a semiconductor process.

Thereafter, the resistance value of the variable resistor 20 is adjusted. First, the first and second input terminals 11 and 12 are brought to the same potential, and the potentials at the first and second input terminals 11 and 12 are set to a potential different from a reference potential Vref. Specifically, the first and second input terminals 11 and 12 are strapped in order to set the potentials Vin1 and Vin2 at the first and second input terminals 11 and 12 to the potential different from the reference potential Vref. For example, when the reference potential Vref is 2 V, the potentials Vin1 and Vin2 are set to 0.

As mentioned above, the first and second input potentials Vin1 and Vin2 are set to the potential different from the reference potential Vref because if the first and second input potentials Vin1 and Vin2 are equal to the reference potential Vref, EQ 1 always comes to Vout=Vref meaning that the reference voltage cannot be adjusted.

According to EQ 4, ideally, the output potential equals the reference potential Vref. Therefore, the resistance value of any of the resistors 1 to 4 is adjusted so that the output potential Vout and reference potential Vref will be substantially equal to each other. In other words, the reference value of any of the resistors 1 to 4 is adjusted so that the condition of $R1 \cdot R4 - R2 \cdot R3 = 0$ will be satisfied. In the present embodiment, the resistance value of the variable resistor 20 of the first resistor 1 is adjusted so that the output potential Vout will substantially equal the reference potential Vref.

When referring to adjusting the variable resistor, the resistor is adjusted until the output potential Vout approaches the reference potential Vref. As a practical matter, it is difficult, though possible, to precisely adjust the resistance value of the variable resistor 20 so that the output potential Vout and reference potential Vref exactly match within a degree of tolerance. The resistance value of the variable resistor 20 is therefore adjusted so that the output potential Vout and reference potential Vref are close to each other in value.

Conceptually, because of the symmetry of connections of resistors, adjustment should be performed under two conditions of R1=R2 and R3=R4. However, it is hard to achieve adjustment under the conditions of R=R2 and R3=R4 with the resistors 1 to 4 interconnected in the differential amplification circuit. In particular, when the differential amplification circuit is integrated in an IC, since a current for measuring a resistance flows into another circuit, it is practically impossible to perform adjustment under the conditions of R1=R2 and R3=R4. However, when the resistance value of the variable resistor 20 is adjusted as mentioned above, the adjustment should be performed under the conditions of Vin1=Vin2 and Vout=Vref. The adjustment should be performed once at the process of adjustment in the course of manufacturing the differential amplification circuit.

Figure 24:
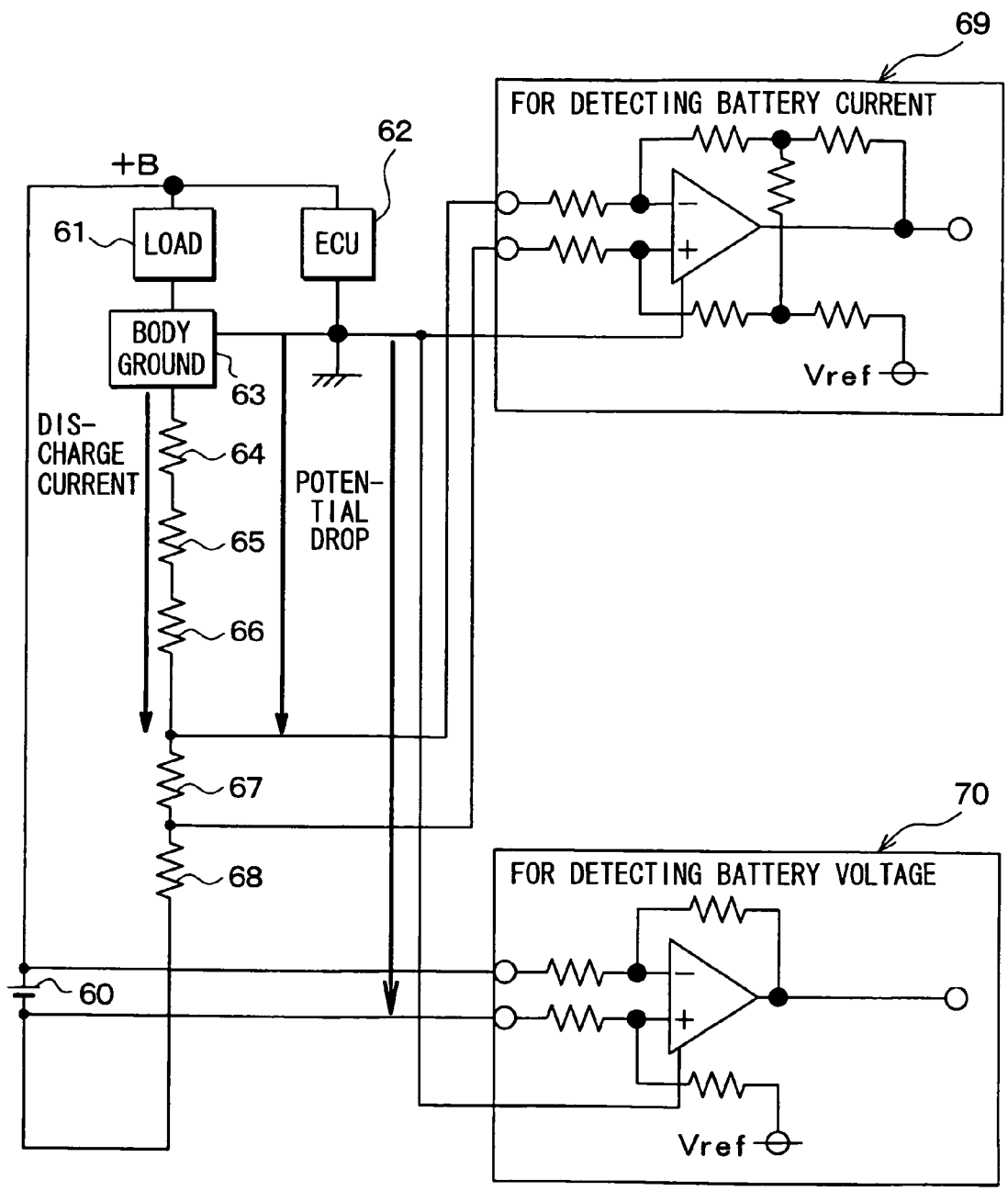
FIG. 24 is a diagram illustrating an object of the invention.

The differential amplification circuit shown in FIG. 1 is, as shown in FIG. 24, used to measure the voltage across the terminals of the battery 60. As described above, the differential amplification circuit shown in FIG. 1 has the resistance value of the variable resistor 20 adjusted and has the offset voltage thereof corrected so as not to depend on the first and second input potentials Vin1 and Vin2. Specifically, an offset voltage derived from a variance in resistances is not observed in the differential amplification circuit.

Consequently, even when the potentials at the terminals of the battery 60 fluctuate due to a voltage drop caused by the fastening bolt contact resistor 64 and harness resistor 65, a potential-dependent error in an offset voltage derived from a variation in resistances in the differential amplification circuit will not be contained in the output potential Vout. Specifically, even when the first and second input potentials Vin1 and Vin2 vary, the adverse effect of the offset voltage on the output potential Vout can be nullified.

In the present embodiment, the first and second input terminals 11 and 12 are brought to the same potential such that the potential Vin1 equals the potential Vin2, and the potentials Vin1 and Vin2 at the first and second input terminals 11 and 12 are equal and are set to a potential different from the reference potential Vref. In a state where the potentials Vin1 and Vin2 are equal and different from Vref, the resistance value of the variable resistor 20 of the first resistor 1 is adjusted so that the output potential Vout and reference potential Vref will be substantially equal to each other.

Consequently, the effect of a variance in resistances in the differential amplification circuit can be nullified, and the offset voltage can be corrected so as not to depend on the first and second input potentials Vin1 and Vin2. Consequently, even when the first and second input potentials Vin1 and Vin2 fluctuate, the offset voltage will not fluctuate. A potential-dependent error in the offset voltage can be prevented from being contained in the output potential Vout. Thus, the adverse effect of the offset voltage derived from a variance in resistances in the differential amplification circuit can be nullified.

Second Embodiment

Figure 3:
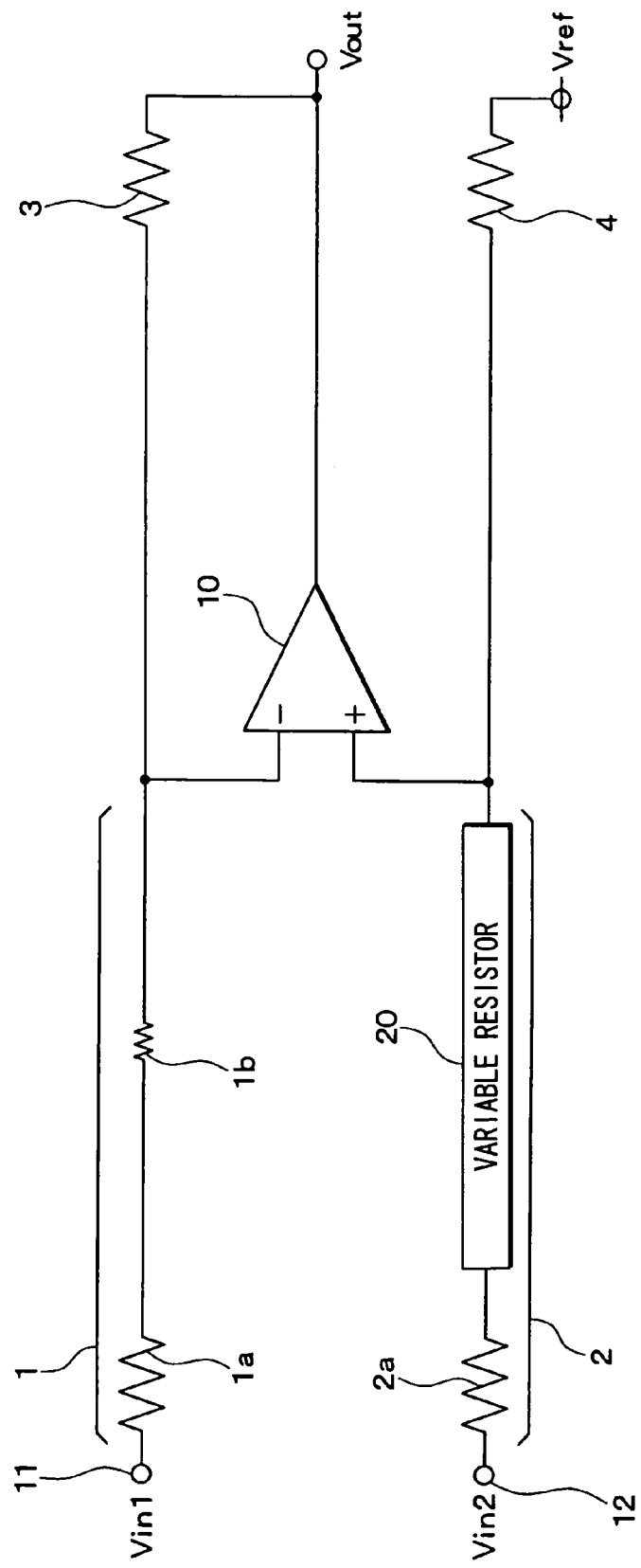
FIG. 3 is a circuit diagram illustrating a differential amplification circuit in accordance with a second embodiment.

A second embodiment will be described focusing primarily on differences from a first embodiment. FIG. 3 is a circuit diagram of a differential amplification circuit in accordance with the present embodiment. As shown in the drawing, a first resistor 1 includes a fixed resistor 1a and a dummy resistor 1b, and a second resistor 2 includes a fixed resistor 2a and a variable resistor 20.

In the present embodiment, the resistance value of the second resistor 2 among the resistors 1 to 4 is adjusted in order to correct the offset voltage of the differential amplification circuit. Thus, the resistance value of the variable resistor 20 included in the second resistor 2 may be adjusted.

Third Embodiment

Figure 4:
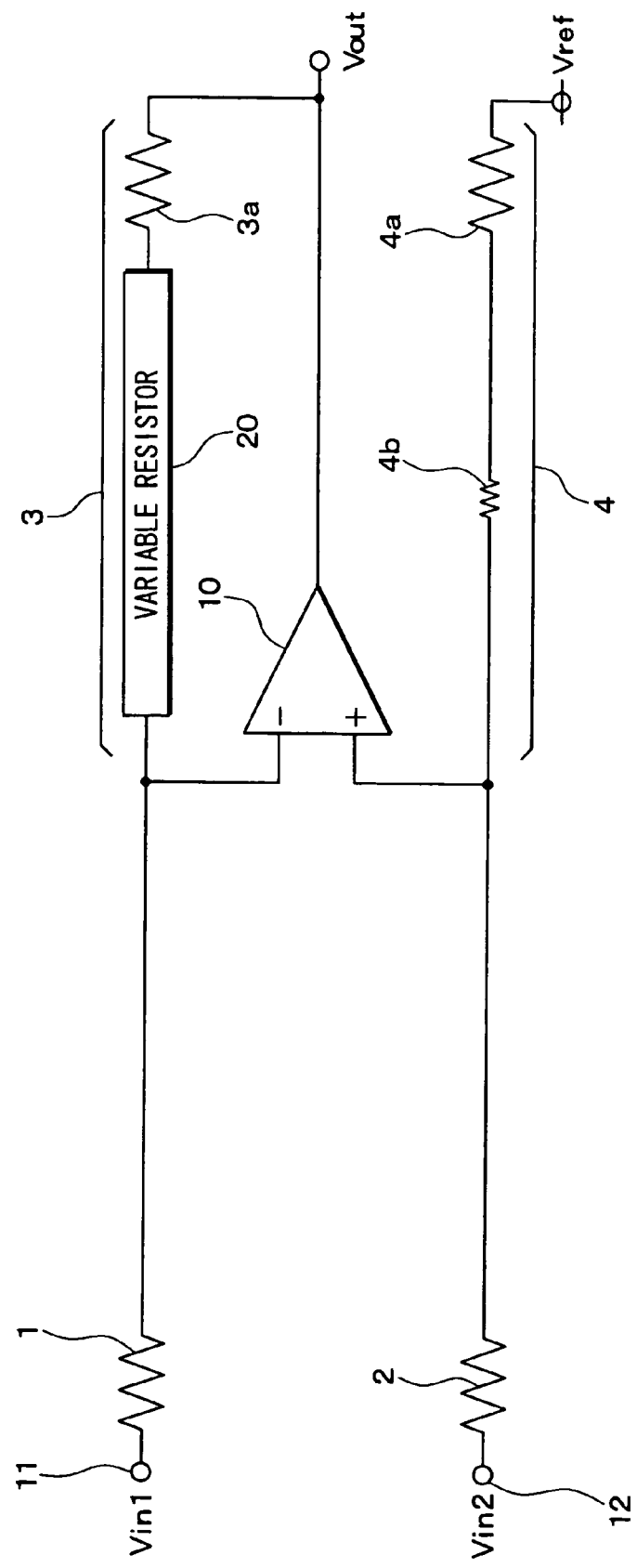
FIG. 4 is a circuit diagram illustrating a differential amplification circuit in accordance with a third embodiment.

A third embodiment will be described focusing primarily on differences from a first and second embodiment. FIG. 4 is a circuit diagram of a differential amplification circuit in accordance with the present embodiment. As shown in the drawing, a third resistor 3 includes a fixed resistor 3a and a variable resistor 20, and a fourth resistor 4 includes a fixed resistor 4a and a dummy resistor 4b. Thus, the circuit form in which the resistance value of the variable resistor 20 included in the third resistor 3 is adjusted will satisfactorily provide the ability for adjustment.

Fourth Embodiment

Figure 5:
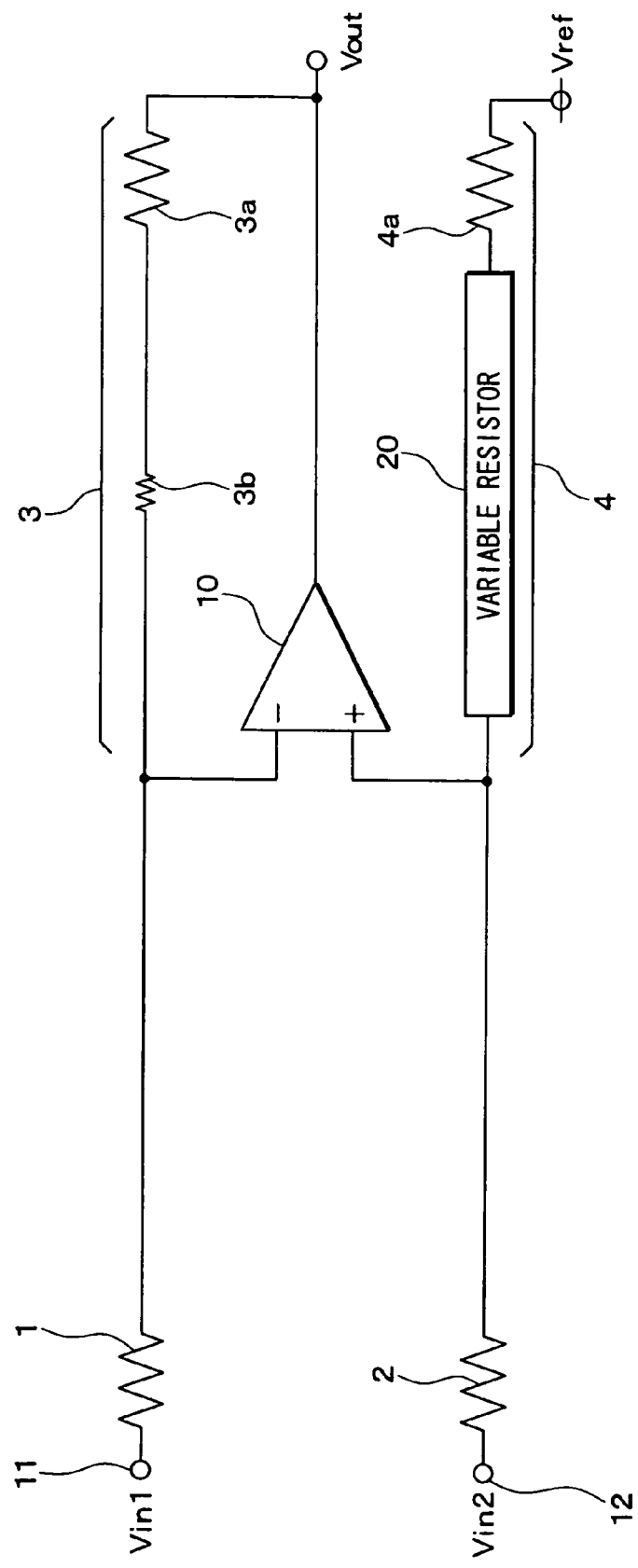
FIG. 5 is a circuit diagram illustrating a differential amplification circuit in accordance with a fourth embodiment.

A fourth embodiment will be described focusing primarily on differences from a first to third embodiments. FIG. 5 is a circuit diagram of a differential amplification circuit in accordance with the present embodiment. As shown in the drawing, a third resistor 3 includes a fixed resistor 3a and a dummy resistor 3b, and a fourth resistor 4 includes a fixed resistor 4a and a variable resistor 20. Thus, the circuit form in which the resistance value of the variable resistor 20 included in the fourth resistor 4 is adjusted will satisfactorily provide the ability for adjustment.

Fifth Embodiment

A fifth embodiment will be described focusing primarily on differences from foregoing embodiments will be described below. In the previously described embodiments, a resistance value is continuously adjusted according to an analog method in which the variable resistor 20 like the one shown in FIG. 2 is employed. In the present embodiment, adjustment of a resistance value is discretely performed according to a digital method. Specifically, the variable resistor 20 included in the aforesaid embodiments is replaced with a digital variable resistor.

Figure 6:
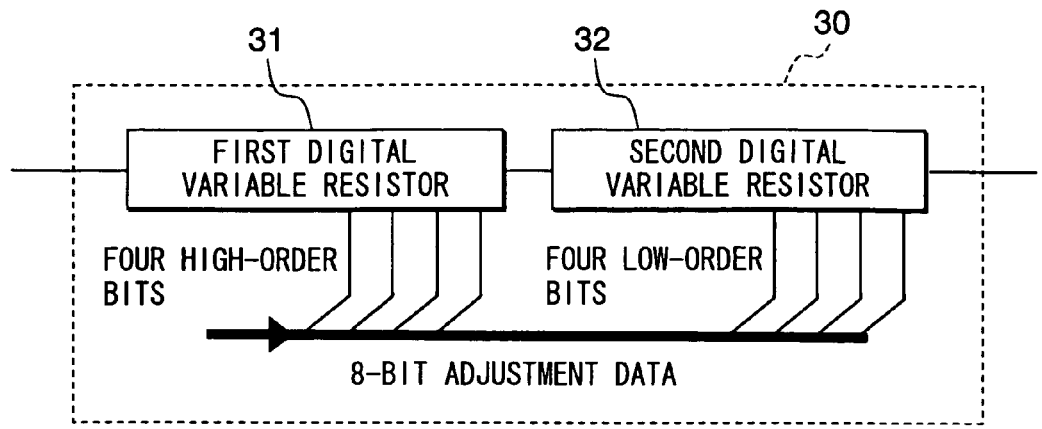
FIG. 6 is a diagram illustrating a digital variable resistor in accordance with a fifth embodiment.

FIG. 6 shows a digital variable resistor 30 in accordance with the present embodiment. The digital variable resistor 30 changes the resistance value thereof according to an externally inputted digital signal. Incidentally, the digital variable resistor 30 can function as the resistance varying means included in the invention. Moreover, the present embodiment handles data of, for example, 8 bits long.

The digital variable resistor 30 includes a first digital variable resistor 31 that handles data of four high-order bits long out of 8-bit data, and a second digital variable resistor 32 that handles data of four low-order bits long.

FIG. 7 is a concrete circuit diagram of the digital variable resistor 30 shown in FIG. 6. As shown in the drawing, each of the first and second digital variable resistors 31 and 32 includes multiple resistors 33 or 33' connected in series with one another, switches 34 that selectively strap arbitrary ones of the multiple resistors 33 or 33', and a selector 35 that switches the switches 34 according to an externally inputted digital signal. The switch 34 can function as a switch means included in the invention.

Figure 8:
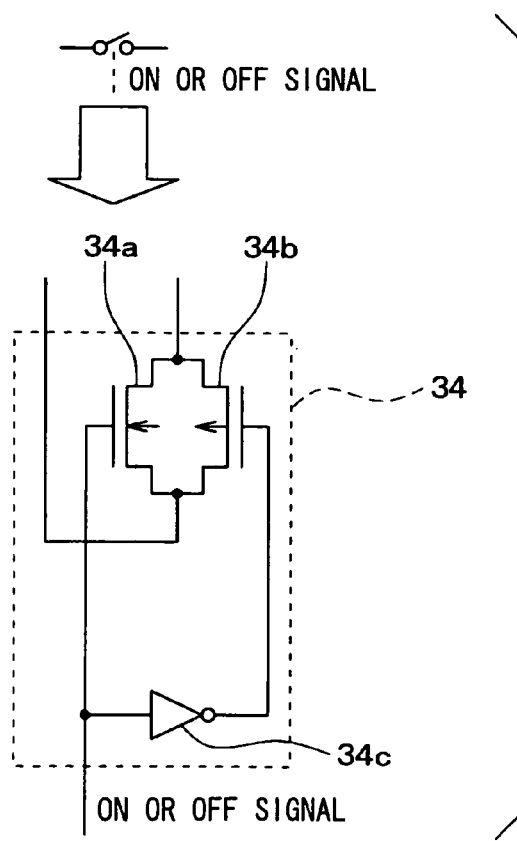
FIG. 8 is a circuit diagram illustrating an example of a switch shown in FIG. 7.

Moreover, FIG. 8 is a circuit diagram showing an example of the switch 34 shown in FIG. 7. As shown in the drawing, the switch 34 is a combination of an n-channel MOS transistor 34a, a p-channel MOS transistor 34b, and an inverter or NOT circuit 34c. When an on or off signal is inputted, the MOS transistors 34a and 34b are turned on or off. Thus, the switch 34 functions as a switch.

Assuming that r denotes the resistance value shared by the multiple resistors 33 included in the first digital variable resistor 31, the resistance value shared by the multiple resistors 33' included in the second digital variable resistor 32 is r/16. The resistance value of the multiple resistors 33' included in the second digital variable resistor 32 is $\frac{1}{16}$ of the resistance value of the multiple resistors 33 included in the first digital variable resistor 31 because the multiple resistors 33' included in the second digital variable resistor 32 are associated with the four low-order bits. Namely, 16 is the fourth power of 2. Thus the ratio of the resistance value of the resistors 33' in digital variable resistor 32 and the resistors 33 in digital variable resistor 31 must be changed according to the number of low-order bits. Moreover, both in the digital variable resistors 31 and 32, the switches 34 are connected among eight resistors 33 or 33' or between junctions 15 and 7, among four resistors 33 or 33' or between junctions 7 and 3, among two resistors 33 or 33' or between junctions 3 and 1, and across one resistor 33 or 33' or between junctions 1 and 0. The configuration of the digital variable resistor 30 included in the present embodiment has been described so far.

Adjustment of the resistance value of the digital variable resistor 30 having the foregoing configuration is performed as described below. To begin with, a differential amplification circuit including the digital variable resistor 30 shown in FIG. 7 is made ready. The differential amplification circuit may have been fabricated on the level of a wafer or may have been mounted in a chip.

Thereafter, similarly to the first embodiment, the first and second input terminals 11 and 12 are strapped, and the potentials Vin1 and Vin2 at the first and second input terminals 11 and 12 are set to a potential different from the reference potential Vref.

Thereafter, 8-bit adjustment data is inputted from an adjustment device (not shown) to the selectors 35 shown in FIG. 7. While the output potential Vout is monitored, 8-bit adjustment data allowing the output potential Vout to approach the reference potential Vref is searched.

8-bit adjustment data allowing the output potential Vout to approach most closely the reference potential Vref is stored in a memory included in an IC in which the differential amplification circuit is incorporated. Consequently, the resistance value of the first resistor 1 shown in FIG. 1 and included in the differential amplification circuit is always adjusted based on the 8-bit adjustment data stored in the ROM.

The present embodiment is characterized by the employment of the digital variable resistor 30. The necessity of employing a resistor including a sliding element, such as, a potentiometer is obviated, but the resistors 33 and 33' whose resistance values are constant can also be employed. Consequently, the differential amplification circuit can be readily incorporated in an IC and the cost thereof can be reduced.

Moreover, since a resistor including a sliding element is not adopted as a variable resistor, there is no fear that a resistance value may fluctuate. The reliability of a differential amplification circuit can be improved. Since the resistance value can be electrically quickly adjusted based on a digital signal, the mass-productivity of the differential amplification circuit is upgraded, and the cost thereof can be minimized.

Even when a bonding wire or a relay is adopted as the switches 34, adjustment can be achieved in the same manner. However, when the bonding wire is adopted, bonding pads each having a large area have to be formed in an IC and strapped with the bonding wire. When the relay is adopted, since multiple relays are needed in addition to the IC, reduction in a cost is hardly achieved due to the need for additional parts.

Sixth Embodiment

A sixth embodiment will be described focusing primarily on differences from foregoing embodiments. In a fifth embodiment, the digital variable resistor 30 includes the switches 34. Each of the switches 34 includes the MOS transistors 34a and 34b. Therefore, the resistances of the MOS transistors 34a and 34b are requested to be zero. In reality, even when an attempt is made to increase the size of the MOS transistors 34a and 34b so as to approach the resistance thereof to zero, an error occurring in handling the LSB is likely to get large. Moreover, the MOS transistors 34a and 34b exhibit a temperature characteristic. In the present embodiment, a configuration of a differential amplification circuit in which the resistance of each switch 34 does not exert an adverse effect will be provided.

Figure 9:
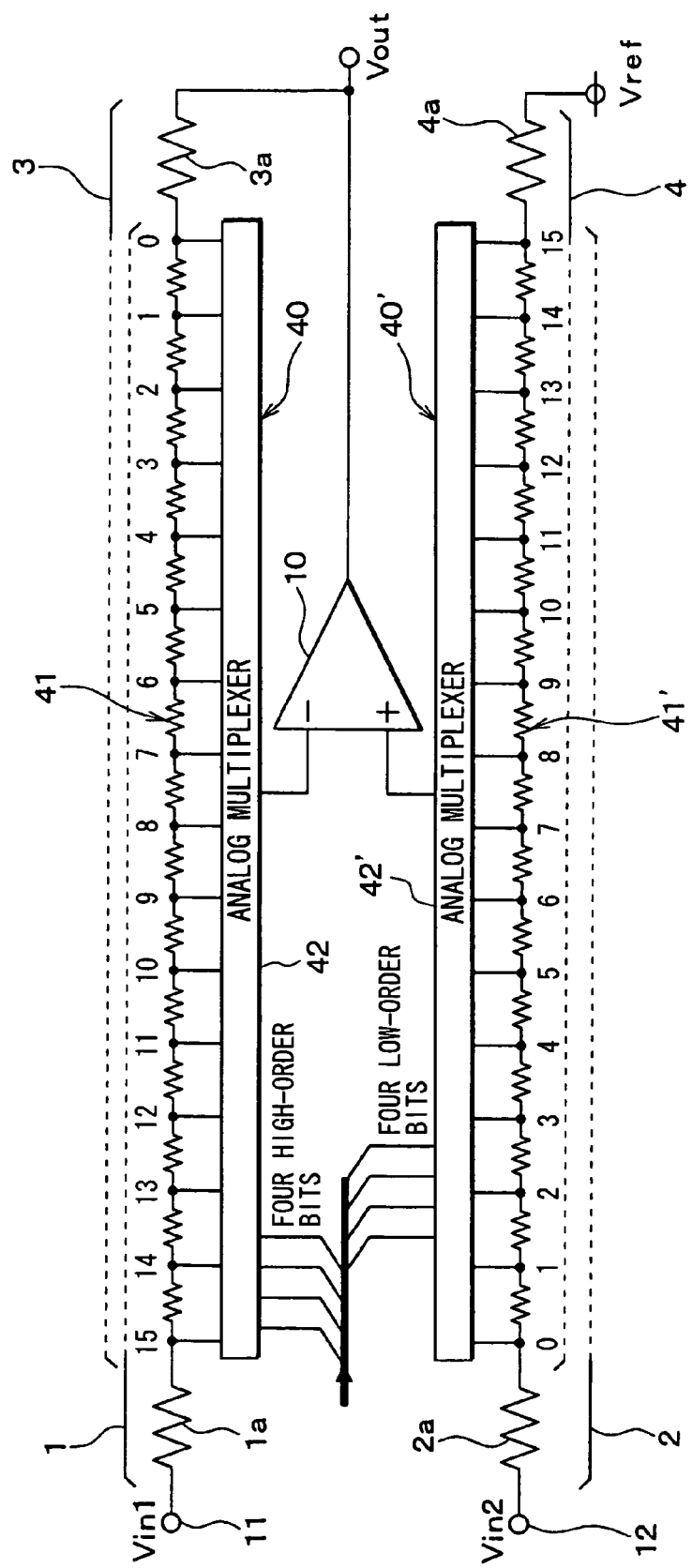
FIG. 9 is a circuit diagram illustrating a differential amplification circuit in accordance with a sixth embodiment.

FIG. 9 is a circuit diagram of a differential amplification circuit in accordance with the present embodiment. As shown in the drawing, the differential amplification circuit includes a digital variable resistor 40 composed of multiple resistors 41 and an analog multiplexer 42 that determines a connection form of the multiple resistors 41 according to an externally inputted digital signal, and a digital variable resistor 40' having the same configuration as the digital variable resistor 40.

Taking the digital variable resistor 40 for instance, a description will be given. The multiple resistors 41 are connected in series with one another between a fixed resistor 1a and a fixed resistor 3a and between a fixed resistor 2a and a fixed resistor 4a. In the present embodiment, the fifteen resistors 41 are connected in series with one another. Moreover, the junctions among the resistors 41 and 41', and the junctions of the resistors 41 and 41' and the fixed resistors 1a to 4a are connected to the analog multiplexers 42 and 42'.

Figure 10:
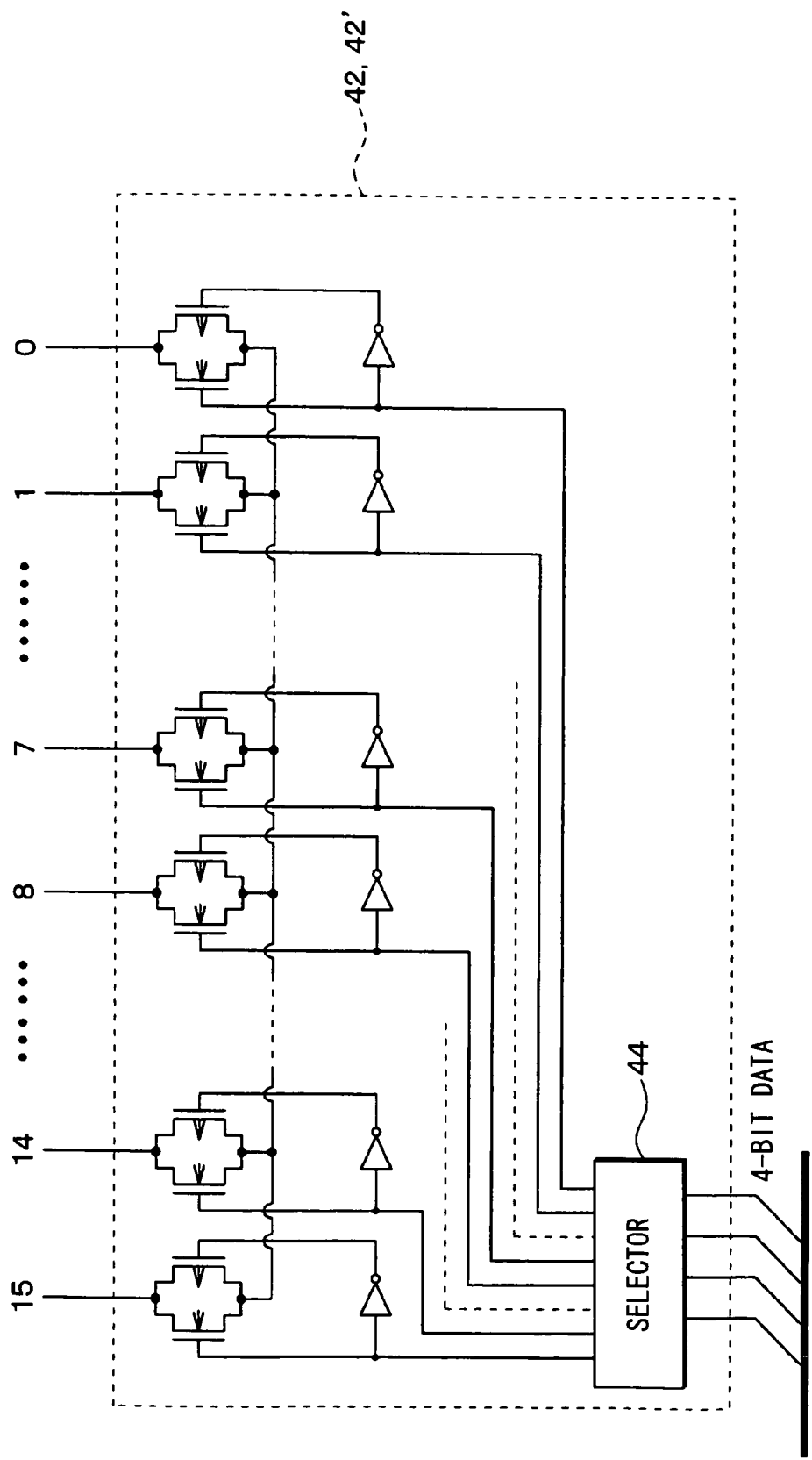
FIG. 10 is a concrete circuit diagram illustrating an analog multiplexer shown in FIG. 9.

FIG. 10 shows the concrete circuitry of the analog multiplexers 42 and 42' shown in FIG. 9. As shown in the drawing, each of the analog multiplexers 42 and 42' has multiple MOS transistors and inverters or NOT circuits combined with each other, and a signal is inputted from a selector 44 to the circuit elements.

In the foregoing configuration, a first resistor 1 includes the fixed resistor 1 and part of the fifteen resistors 41. A third resistor 3 includes the fixed resistor 3a and those of the fifteenth resistors 41 other than part thereof included in the first resistor 1. For example, the fixed resistor 1a and the resistors 41 located between the junctions 15 to 8 out of all the resistors 41 constitute the first resistor 1, and the resistors located between the junctions 8 to 0 and the fixed resistor 3a constitute the third resistor 3.

In other words, the resistors 41 may be connected on the first resistor 1 side or on the third resistor 3 side. The same applies to second and fourth resistors 2 and 4. Thus, whether the resistors 41 lie on the first resistor 1 side or on the third resistor 3 side, the substantial resistance values of the resistors 1 and 4 can be increased or decreased. Consequently, a variance in resistance values can be adjusted.

Furthermore, the ratio of the resistance value shared by the multiple resistors 41 on the side of the inverting input terminal of the operational amplifier 10 to the resistance value shared by the multiple resistors 41' on the side of the non-inverting input terminal of the operational amplifier 10 is set to 16:1. Moreover, when the resistors on the side of the inverting input terminal of the operational amplifier 10 and the resistors on the side of the non-inverting input terminal thereof are combined, 16×16=256 different resistance values can be provided. That is, the number of adjustment steps represented by 8 bits is realized. The resistors on the side of the inverting input terminal of the operational amplifier 10 are associated with four high-order bits, and the resistors on the side of the non-inverting input terminal thereof are associated with four low-order bits.

In other words, the resolution of the digital variable resistor 40 connected to the inverting input terminal of the operational amplifier 10 is different from the resolution of the digital variable resistor 40' connected to the non-inverting input terminal thereof. Consequently, the number of adjustment steps for the resistance value of the differential amplification circuit equals the product of the number of steps supported by the digital variable resistor 40 by the number of steps supported by the digital variable resistor 40'. The differential amplification circuit can therefore be constructed with a small number of resistors and a small number of switches. The ratio of the resistance value shared by the multiple resistors 41 to the resistance value shared by the multiple resistors 41' is 16:1 because the multiple resistors 41' are associated with the four low-order bits, or that 16 is the fourth power of 2. Consequently, the ratio must be changed according to the number of low-order bits.

Assuming the multiple resistors 41 and multiple resistors 41' are not allocated to the respective input terminals of the operational amplifier but the multiple resistors 41 or 41' are disposed on the side of one of the input terminals of the operational amplifier 10, 255 resistors 41 or 41' and 256 analog switches are needed. However, when the multiple resistors 41 and multiple resistors 41' are allocated to the respective input terminals of the operational amplifier, thirty resistors 41 and 41' and thirty-two analog switches should merely be made ready. Consequently, a chip size can be reduced and a cost can be minimized. The idea may be extended, and the number of groups of resistors to be switched may be doubled. The number of adjustment steps comes to 32×32=1024 or a value represented by 10 bits.

If the operational amplifier 10 having MOS transistors in an input stage thereof is used in the configuration shown in FIG. 9 and FIG. 10, a current does not flow into the input terminals of the operational amplifier 10. No current therefore flows into the analog switches or MOS transistors in the analog multiplexers 42 and 42'. An advantage of such a configuration is that an error derived from resistances introduced by the analog switches will not occur. Namely, the size of the MOS transistor to be adopted as the analog switches can be reduced.

For adjustment of a variance in resistances in the differential amplification circuit shown in FIG. 9, similarly to that in the fifth embodiment, a digital signal is externally inputted to the analog multiplexers 42 and 42'.

For example, assuming that 8-bit adjustment data is 01110111, that is, the four high-order bits represent 7 and the four low-order bits represent 7, the seventh tap or junction is selected via each of the analog multiplexers 42 and 42'. On the side of the inverting input terminal of the operational amplifier 10, the resistance value of the first resistor 1 comes to a synthetic resistance value of the resistances of the fixed resistor 1a and the resistors 41 located between the junctions 15 to 7. Moreover, the resistance value of the third resistor 3 comes to a synthetic resistance value of the resistances of the fixed resistor 3a and the resistors 41 located between the junctions 7 to 0.

As mentioned above, since the ratio of the resistance value shared by the multiple resistors 41 on the side of the inverting input terminal to the resistance value shared by the multiple resistors 41' on the side of the non-inverting input terminal is set to 16:1, that is, the resistance value of the digital variable resistor 40 is different from the resistance value of the digital variable resistor 40', the resistance values of the resistors 1a, 2a, 3a, and 4a are increased or decreased if necessary. Moreover, each of the resistors 1a, 2a, 3a, and 4a may be composed of multiple resistors or may be replaced with a dummy resistor in the same manner as that in the other embodiments.

On the side of the non-inverting input terminal of the operational amplifier 10, the resistance value of the second resistor 2 comes to a synthetic resistance value of the resistances of the fixed resistor 2a and the resistors 41' located between the junctions 0 to 7, and the resistance value of the fourth resistor 4 comes to a synthetic resistance value of the resistances of the fixed resistor 4a and the resistors 41' located between the junctions 7 to 15.

Since the analog multiplexers 42 and 42' are adopted as a resistance varying means, no current flows into the analog switches in the analog multiplexers 42 and 42'. Consequently, occurrence of an error attributable to the analog switches or MOS transistors can be prevented. Consequently, a high-precision differential amplification circuit can be readily incorporated in an IC.

Seventh Embodiment

A seventh embodiment will be described focusing primarily on differences from foregoing embodiments. In relation to the aforesaid embodiments, the differential amplification circuits having the circuit form shown in FIG. 1 have been described. In relation to the present embodiment, a differential amplification circuit having another circuit form will be described below.

Figure 11:
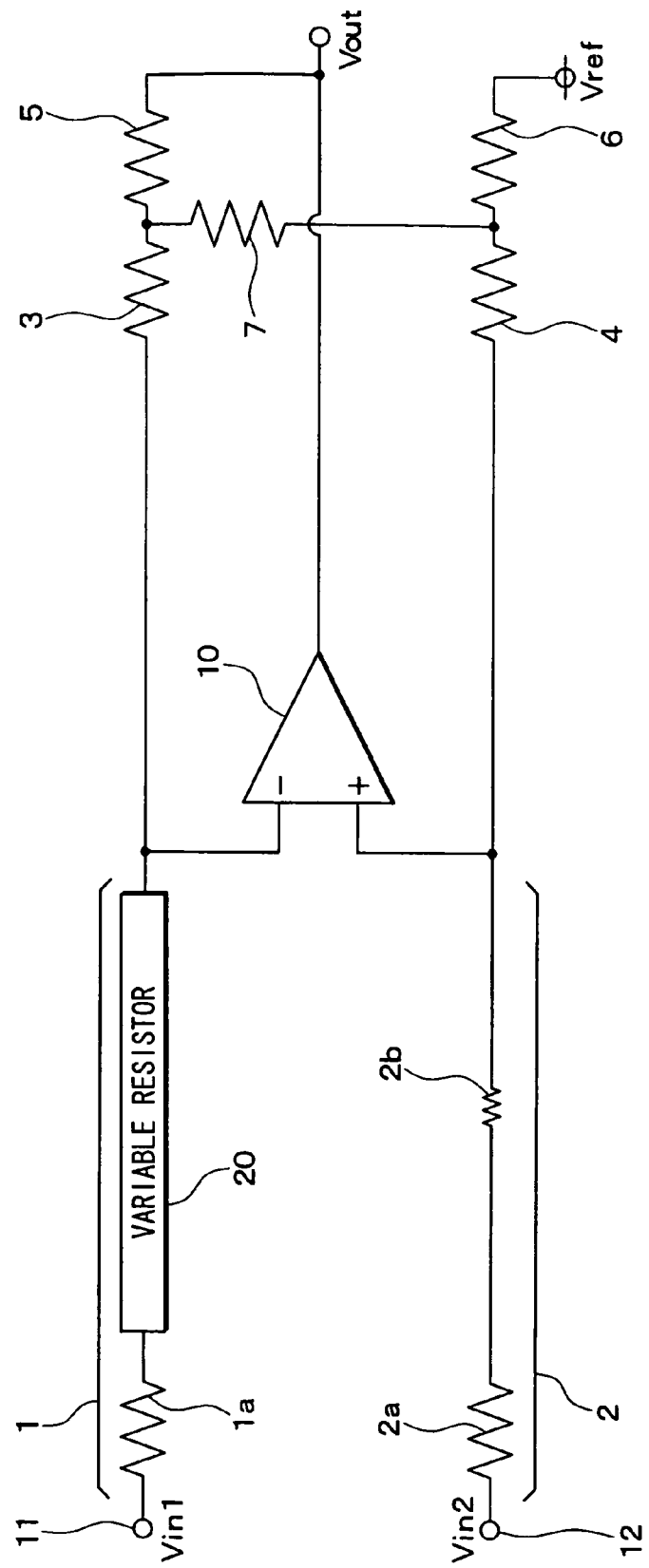
FIG. 11 is a circuit diagram illustrating a differential amplification circuit in accordance with a seventh embodiment.

FIG. 11 is a circuit diagram of a differential amplification circuit in accordance with the present embodiment. As shown in the drawing, the differential amplification circuit includes a first resistor 1, a second resistor 2, a third resistor 3, a fourth resistor 4, a fifth resistor 5, a sixth resistor 6, a seventh resistor 7, and an operational amplifier 10. The connection form for the first and second resistors 1 and 2 is identical to that shown in FIG. 1.

The third resistor 3 is connected to an inverting input terminal of an operational amplifier 10, and the fourth resistor 4 is connected to the non-inverting input terminal of the operational amplifier 10. The fifth resistor 5 is connected in series with the third resistor 3 between the third resistor 3 and the output terminal of the operational amplifier 10. The sixth resistor 6 is connected in series with the fourth resistor 4 between the fourth resistor 4 and a reference potential point. The seventh resistor 7 is connected between the junction of the third and fifth resistors 3 and 5 and the junction of the fourth and sixth resistors 4 and 6. The potential at the output terminal of the operational amplifier 10 is handled as an output potential Vout. The seventh resistor 7 is a resistor for controlling the gain of the differential amplification circuit shown in FIG. 11.

What is referred to as the resistance value of the first resistor 1 is a substantial resistance value within a range from a first input terminal 11 to the inverting input terminal of the operational amplifier 10. If the first resistor 1 includes multiple resistors, the resistance value of the first resistor is a synthetic resistance value of the resistances of the resistors. What is referred to as the resistance value of the second resistor 2 is a substantial resistance value within a range from a second input terminal 12 to the non-inverting input terminal of the operational amplifier 10. What is referred to as the resistance value of the third resistor 3 is a substantial resistance value within a range from the inverting input terminal of the operational amplifier 10 to the junction of the fifth and seventh resistors 5 and 7. What is referred to as the resistance value of the fourth resistor 4 is a substantial resistance value within a range from the non-inverting input terminal of the operational amplifier 10 to the junction of the sixth and seventh resistors 6 and 7. What is referred to as the resistance value of the fifth resistor 5 is a substantial resistance value within a range between the junction of the third and seventh resistors 3 and 7 and the output terminal of the operational amplifier 10. What is referred to as the resistance value of the sixth resistor 6 is a substantial resistance value within a range between the junction of the fourth and seventh resistors 4 and 7 and the reference potential point.

The first resistor 1 has, similarly to that shown in FIG. 1, a fixed resistor 1a and a variable resistor 20 connected in series with each other. The second resistor 2 has, similarly to that included in the second embodiment, a fixed resistor 2a and a dummy resistor 2b connected in series with each other.

In the differential amplification circuit shown in FIG. 11, the output potential Vout can be expressed as follows (EQ 5).

$$Vout=\{(Vin1-Vin2)\cdot A+Vin1\cdot B-Vin2\cdot C+Vref\cdot D\}/E \quad (EQ\ 5)$$

Assuming that R1 denotes the resistance value of the first resistor 1, R2 denotes the resistance value of the second resistor 2, R3 denotes the resistance value of the third resistor 3, R4 denotes the resistance value of the fourth resistor 4, R5 denotes the resistance value of the fifth resistor 5, R6 denotes the resistance value of the sixth resistor 6, and R7 denotes the resistance value of the seventh resistor 7, $A=(R1+R3+R5)\cdot R4\cdot R6+(R4+R6)\cdot R3\cdot R5+(R3\cdot R4+R4\cdot R5+R5\cdot R6+F6\cdot R3)\cdot R7$, $B=R2\cdot R3\cdot R5-(R1\cdot R4-R2\cdot R3)\cdot R6+R2\cdot(R3+R5)\cdot R7$, $C=R1\cdot R4\cdot R5+R1\cdot(R4+R6)\cdot R7$, $D=(R1\cdot R4-R2\cdot R3)\cdot R5-R2\cdot(R1+R3+R5)\cdot R7$, and $E=-(R1\cdot R4-R2\cdot R3)\cdot R6-R1\cdot(R2+R4+R6)\cdot R7$ are established.

In order to realize the differential amplification circuit in which the output potential Vout does not depend on the first and second input potentials Vin1 and Vin2, that is, an ideal differential amplification circuit, the output potential Vout should be expressed by EQ 2 presented in relation to a first embodiment. A condition under which the equation 5 is squared with the equation 2 is that B equals C, that is, $R2\cdot R3\cdot R5-(R1\cdot R4-R2\cdot R3)\cdot R6+R2\cdot(R3+R5)\cdot R7=R1\cdot R4\cdot R5+R1\cdot(R4+R6)\cdot R7$. The conditions under which the noted equation can be established are as follow (EQ 6 and EQ 7).

$$R1\cdot R4=R2\cdot R3 \quad (EQ\ 6)$$

$$R1\cdot R6=R2\cdot R5 \quad (EQ\ 7)$$

The conditions under which the output potential does not depend on the first and second input potentials Vin1 and Vin2 are expressed in EQ 6 and EQ 7. In the above relations it should be noted that the seventh resistor 7 alone is not involved. As a practical matter, it is difficult to adjust a resistance value using the EQ 6 and EQ 7. However, when the EQ 6 and EQ 7 are applied to the equation 5, D=1 is obtained and the following equation is given (EQ 8).

$$Vout=(Vin1-Vin2)\cdot(A+C)/E+Vref \quad (EQ\ 8)$$

A condition under which the output potential does not depend on the first and second input potentials Vin1 and Vin2 is expressed in EQ 8. Similar to the first embodiment, first, the first and second input terminals 11 and 12 are brought to the same potential, and the potentials at the first and second input terminals 12 are set to a potential different from the reference potential Vref. The resistance value of any of the first, second, third, fourth, fifth, and sixth resistors 1, 2, 3, 4, 5, and 6 is then adjusted so that the output potential Vout and reference potential Vref will be substantially equal to each other. In the present embodiment, the resistance value of the variable resistor 20 of the first resistor 1 is adjusted.

Conceptually, adjustment should be performed under the three conditions of R1=R2, R3=R4, and R5=F6 because of the symmetry of connections of resistors. However, there is difficulty in performing adjustment under the three conditions with the resistors 1 to 7 interconnected in the circuit. Adjustment should be performed under the conditions of Vin1=Vin2 and Vout=Vref. Namely, the adjustment is achieved by substantially adjusting the resistance value of the first resistor 1 so that the conditions of R1·R4−R2·R3=0 and R1·R6−R2·R5=0 will be satisfied.

As the variable resistor 20, the potentiometer shown in FIG. 2 or the digital variable resistor 30 shown in FIG. 6 may be adopted.

As mentioned above, even in the differential amplification circuit having the circuit form shown in FIG. 11, similarly to the differential amplification circuit shown in FIG. 1, an offset voltage derived from a variance in resistances can be corrected by adjusting a resistance value.

In the system shown in, for example, FIG. 24, the differential amplification circuit of the present embodiment can be used to detect a current flowing into the shunt resistor 67. Since the variance in resistances in the differential amplification circuit is corrected, even if the potentials at the terminals of the shunt resistor 67 vary due to the fastening bolt contact resistor 64 and others, a voltage-dependent error in the offset voltage will not be contained in the output potential Vout of the differential amplification circuit.

Eighth Embodiment

Figure 12:
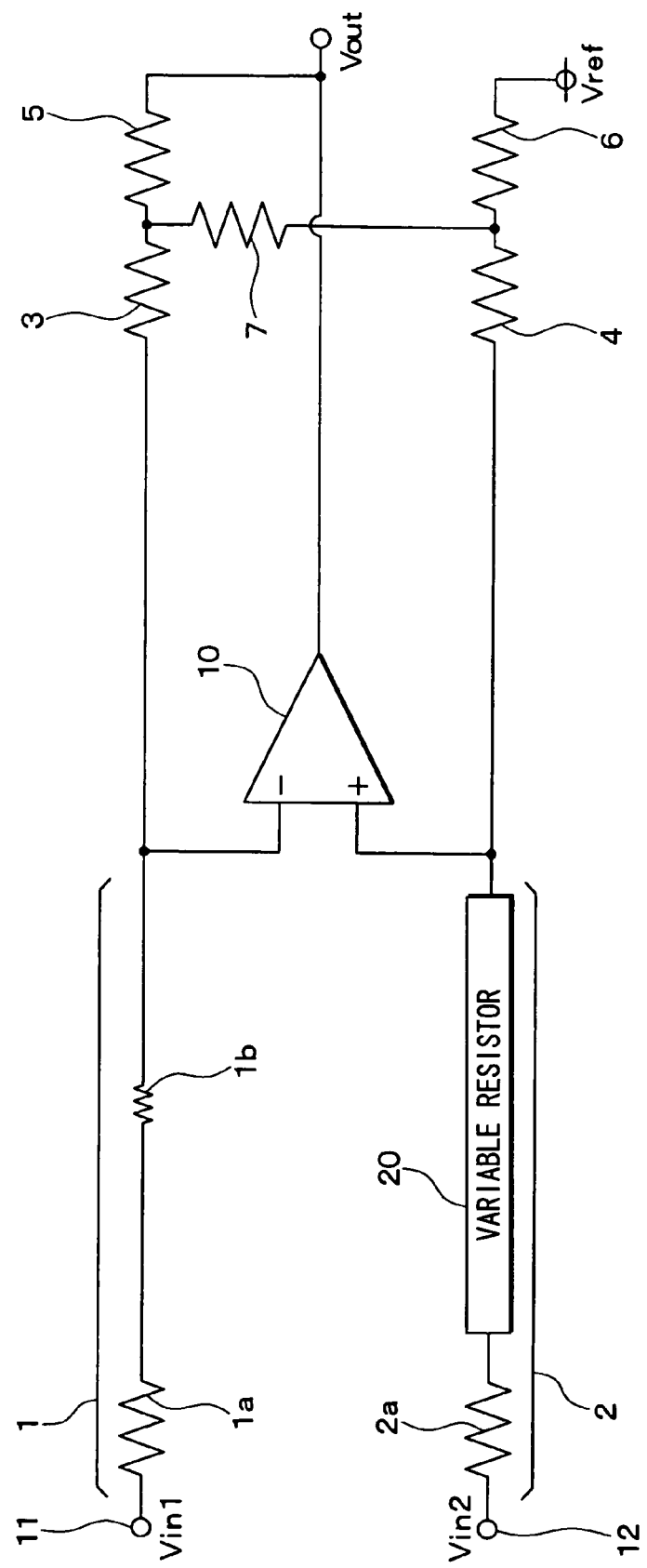
FIG. 12 is a circuit diagram illustrating a differential amplification circuit in accordance with an eighth embodiment.

As for the present embodiment, only a difference from the seventh embodiment will be described below. FIG. 12 is a circuit diagram of a differential amplification circuit in accordance with the present embodiment. As shown in the drawing, a first resistor 1 includes a fixed resistor 1a and a dummy resistor 1b, and a second resistor 2 includes a fixed resistor 2a and a variable resistor 20. Thus, a circuit form in which the resistance value of the variable resistor 20 included in the second resistor 2 is adjusted can be used.

Ninth Embodiment

Figure 13:
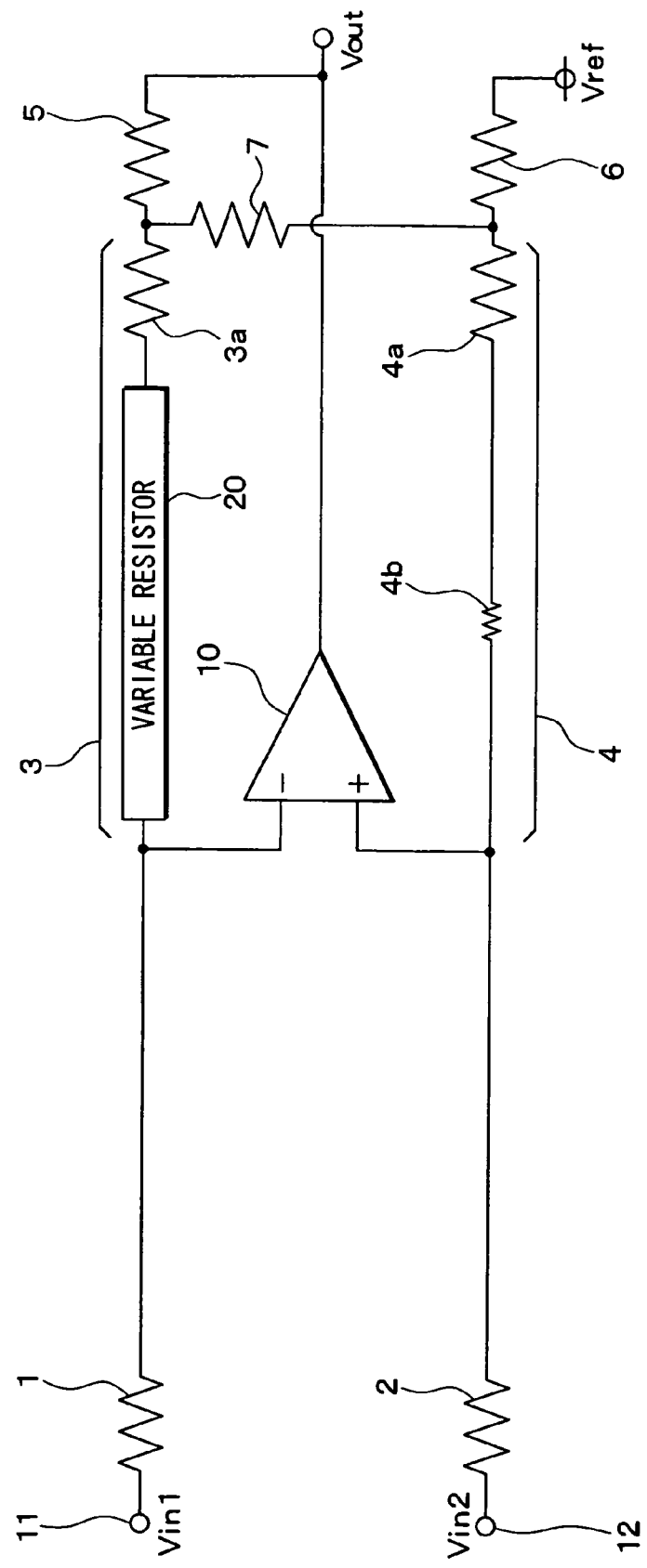
FIG. 13 is a circuit diagram illustrating a differential amplification circuit in accordance with a ninth embodiment.

As for the present embodiment, only a difference from the seventh embodiment will be described below. FIG. 13 is a circuit diagram of a differential amplification circuit in accordance with the present embodiment. As shown in the drawing, a third resistor 3 includes a fixed resistor 3a and a variable resistor 20, and a fourth resistor 4 includes a fixed resistor 4a and a dummy resistor 4b. Thus, the circuit form in which the resistance value of the variable resistor 20 included in the third resistor 3 is adjusted can be used.

Tenth Embodiment

Figure 14:
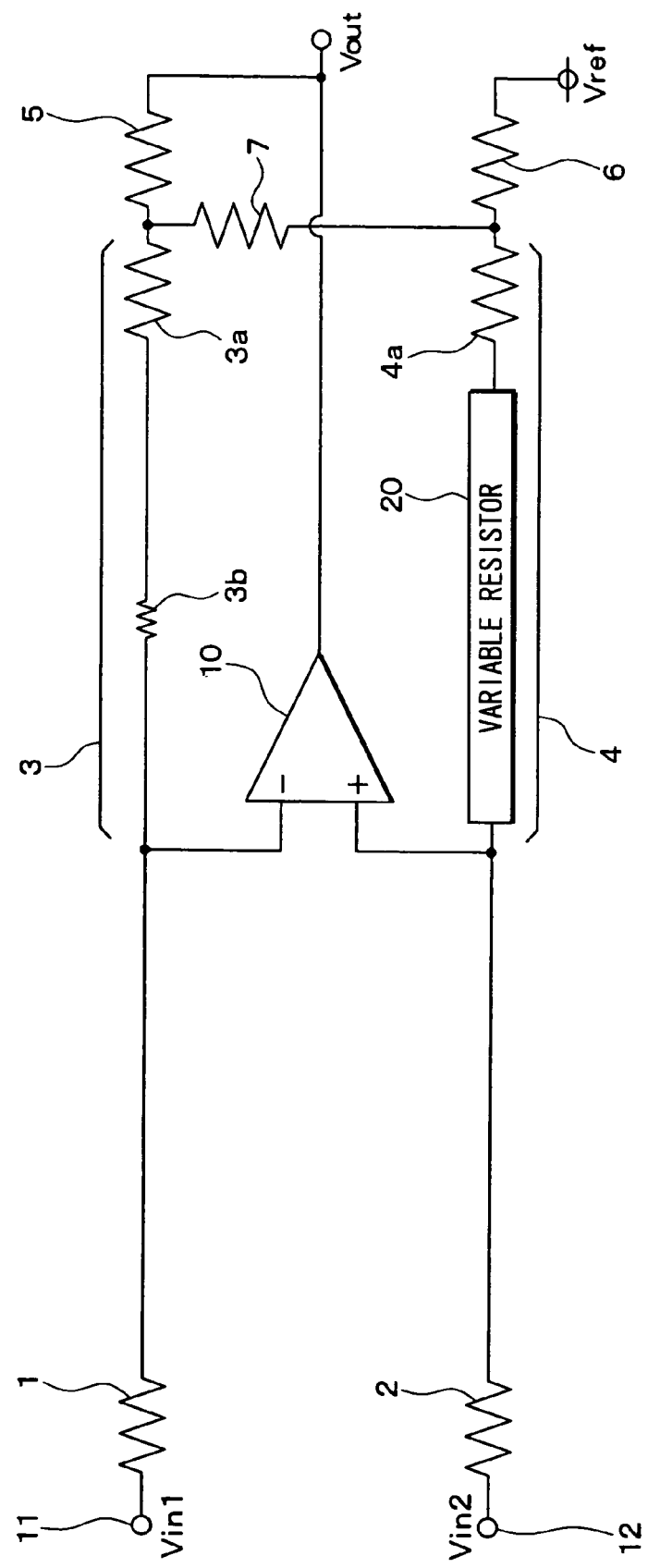
FIG. 14 is a circuit diagram illustrating of a differential amplification circuit in accordance with a tenth embodiment.

As for the present embodiment, only a difference from the seventh embodiment will be described below. FIG. 14 is a circuit diagram of a differential amplification circuit in accordance with the present embodiment. As shown in the drawing, a third resistor 3 includes a fixed resistor 3a and a dummy resistor 3b, and a fourth resistor 4 includes a fixed resistor 4a and a variable resistor 20. Thus, a circuit form in which the resistance value of the variable resistor 20 included in the fourth resistor 4 is adjusted can be used.

Eleventh Embodiment

Figure 15:
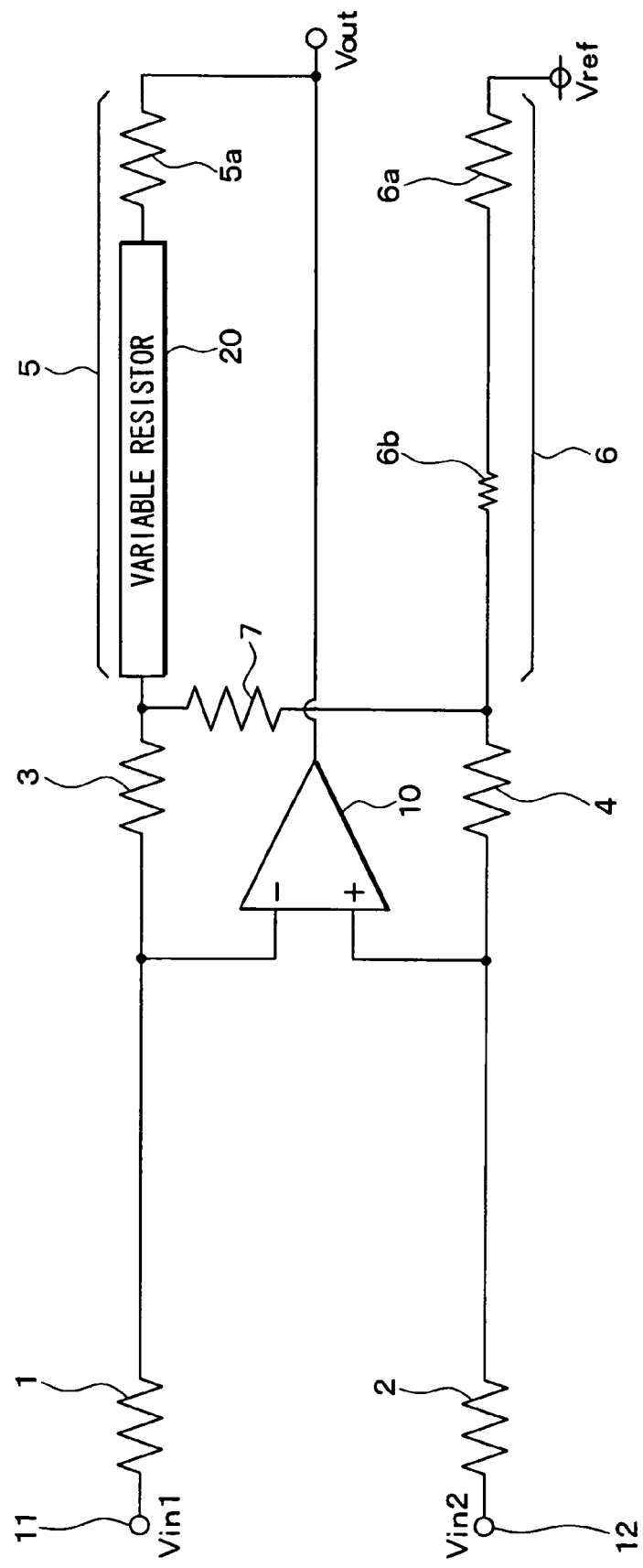
FIG. 15 is a circuit diagram illustrating a differential amplification circuit in accordance with an eleventh embodiment.

As for the present embodiment, only a difference from the seventh embodiment will be described below. FIG. 15 is a circuit diagram of a differential amplification circuit in accordance with the present embodiment. As shown in the drawing, a fifth resistor 5 includes a fixed resistor 5a and a variable resistor 20, and a sixth resistor 6 includes a fixed resistor 6a and a dummy resistor 6b. Thus, a circuit form in which the resistance value of the variable resistor 20 included in the fifth resistor 5 is adjusted can be used.

Twelfth Embodiment

Figure 16:
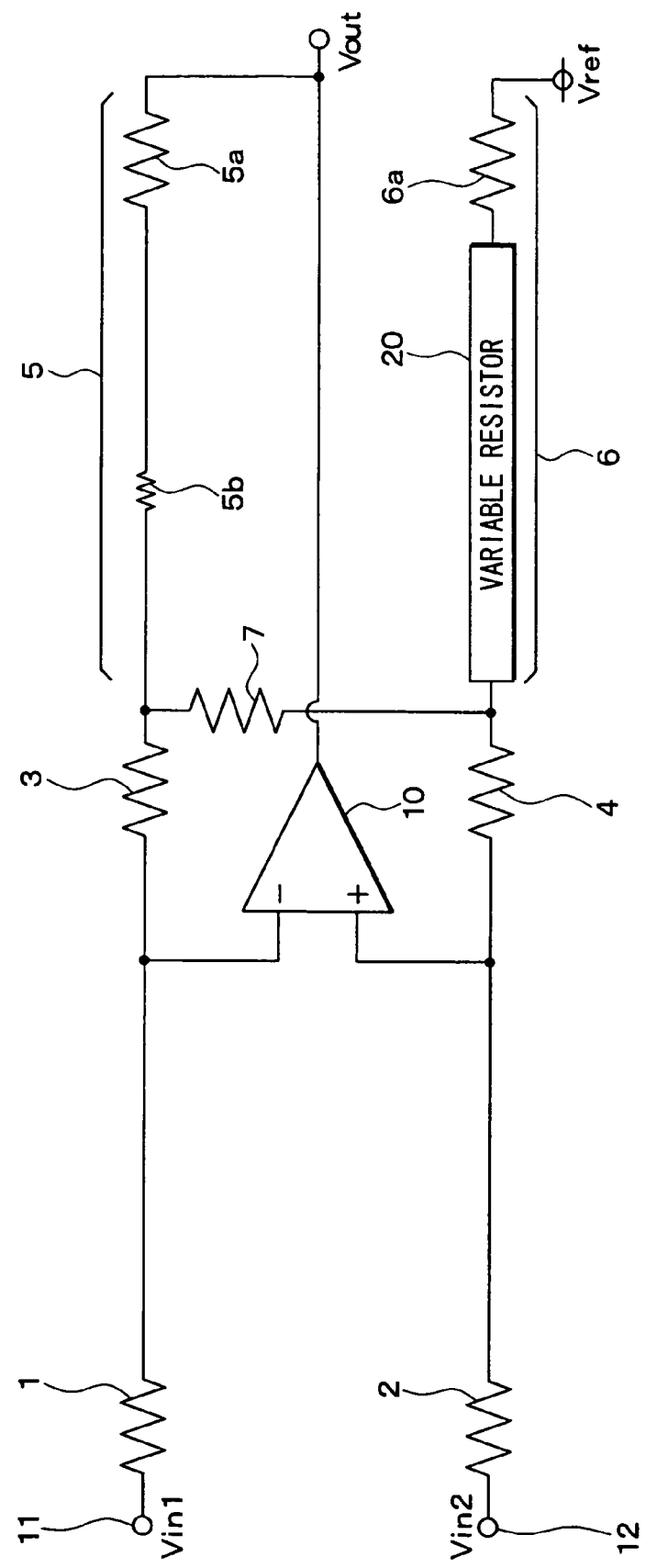
FIG. 16 is a circuit diagram illustrating a differential amplification circuit in accordance with a twelfth embodiment.

As for the present embodiment, only a difference from the seventh embodiment will be described below. FIG. 16 is a circuit diagram of a differential amplification circuit in accordance with the present embodiment. As shown in the drawing, a fifth resistor 5 includes a fixed resistor 5a and a dummy resistor 5b, and a sixth resistor 6 includes a fixed resistor 6a and a variable resistor 20. Thus, the circuit form in which the resistance value of the variable resistor 20 included in the sixth resistor 6 is adjusted can be used.

Thirteenth Embodiment

Figure 17:
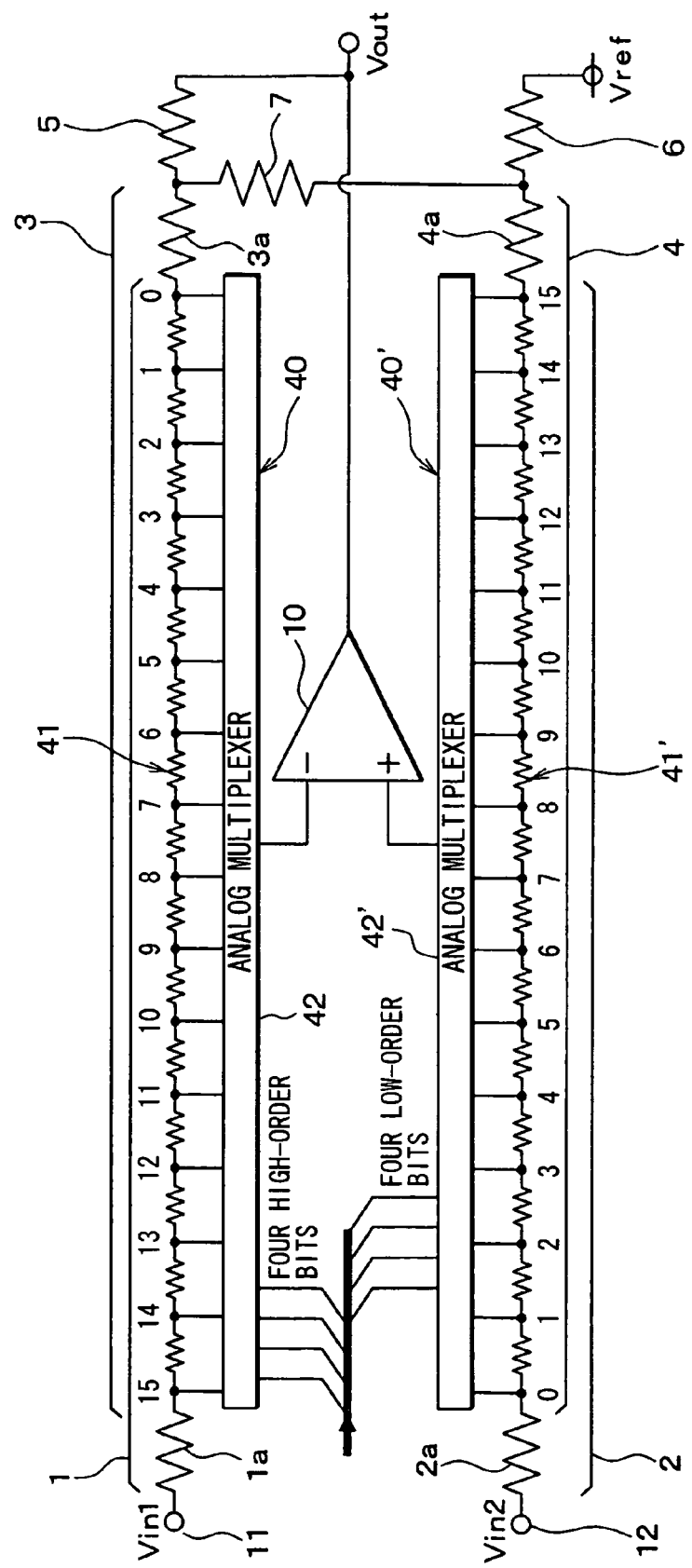
FIG. 17 is a circuit diagram illustrating a differential amplification circuit in accordance with a thirteenth embodiment.

As for the present embodiment, only a difference from the seventh embodiment will be described below. FIG. 17 is a circuit diagram of a differential amplification circuit in accordance with the present embodiment. As shown in the drawing, the present embodiment adopts a circuit form in which the digital variable resistors 40 and 40' shown in FIG. 9 are included. Thus, the analog multiplexers 42 and 42' are used to adjust the resistance values of the first to fourth resistors 1 to 4 connected to the operational amplifier 10.

The configuration of the digital variable resistors 40 and 40' and the advantage thereof are identical to those of the sixth embodiment.

Fourteenth Embodiment

Figure 18:
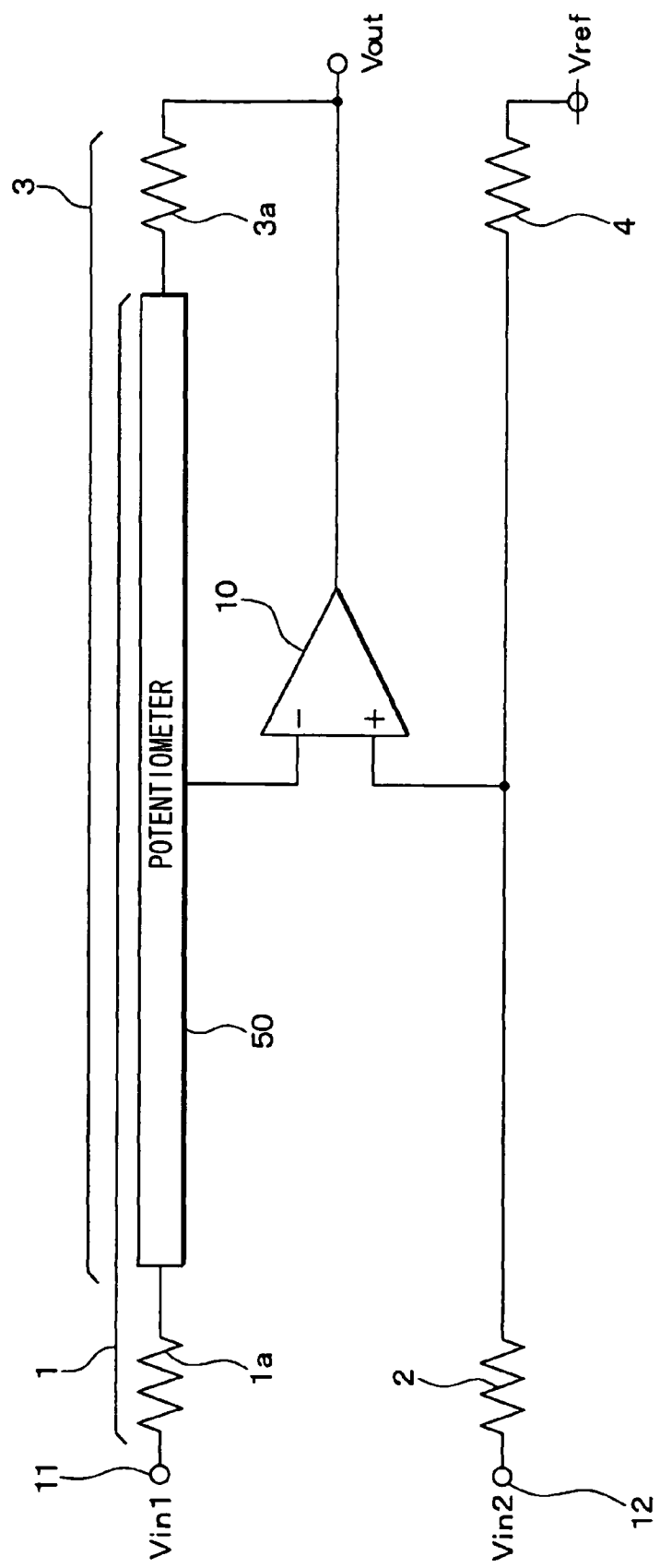
FIG. 18 is a circuit diagram illustrating a differential amplification circuit in accordance with a fourteenth embodiment.

As for the present embodiment, only a difference from the above described embodiments will be described below. FIG. 18 is a circuit diagram of a differential amplification circuit in accordance with the present embodiment. As shown in the drawing, a potentiometer 50 is connected to the inverting input terminal of an operational amplifier 10. A first resistor 1 includes a fixed resistor 1a and the potentiometer 50, while a third resistor 3 includes a fixed resistor 3a and the potentiometer 50.

Figure 19A:
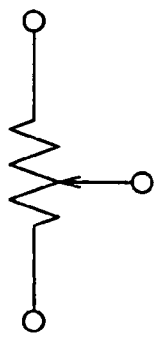
FIG. 19A and FIG. 19B show illustrating examples of a potentiometer shown in FIG. 18.
Figure 19B:
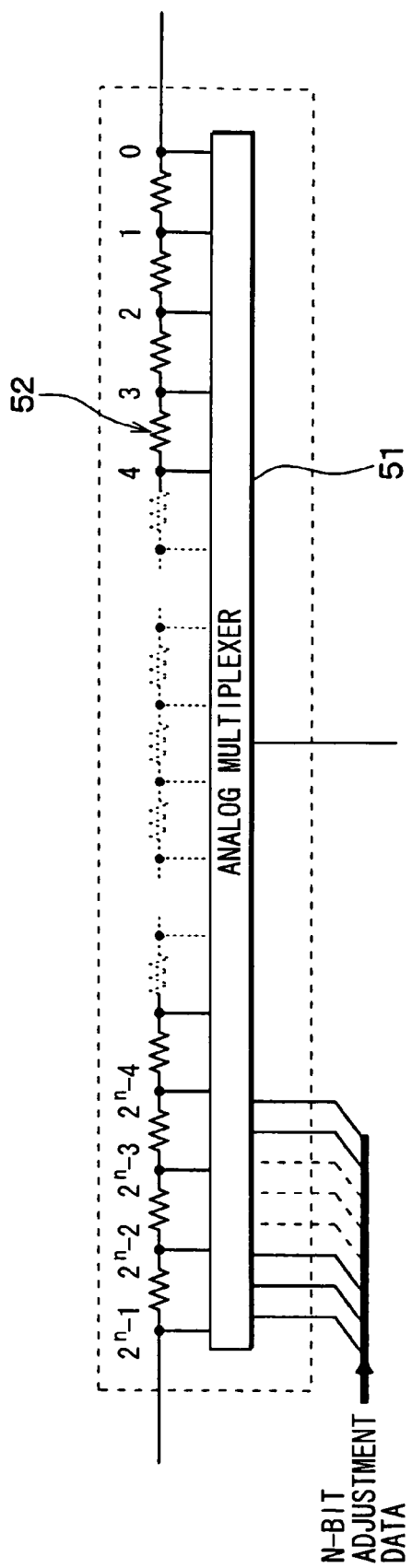

FIG. 19 shows an example of the potentiometer 50 shown in FIG. 18. FIG. 19A shows an analog type of potentiometer 50 including a sliding element. FIG. 19B shows a digital type of potentiometer 50 that includes an analog multiplexer 51 and multiple resistors 52 and that handles n-bit adjustment data. Thus, either of the potentiometers shown in FIG. 19A and FIG. 19B can be adopted as the potentiometer 50 shown in FIG. 18.

The differential amplification circuit having the circuit form in which the potentiometer 50 is connected to the inverting input terminal of the operational amplifier 10 can be used.

Fifteenth Embodiment

Figure 20:
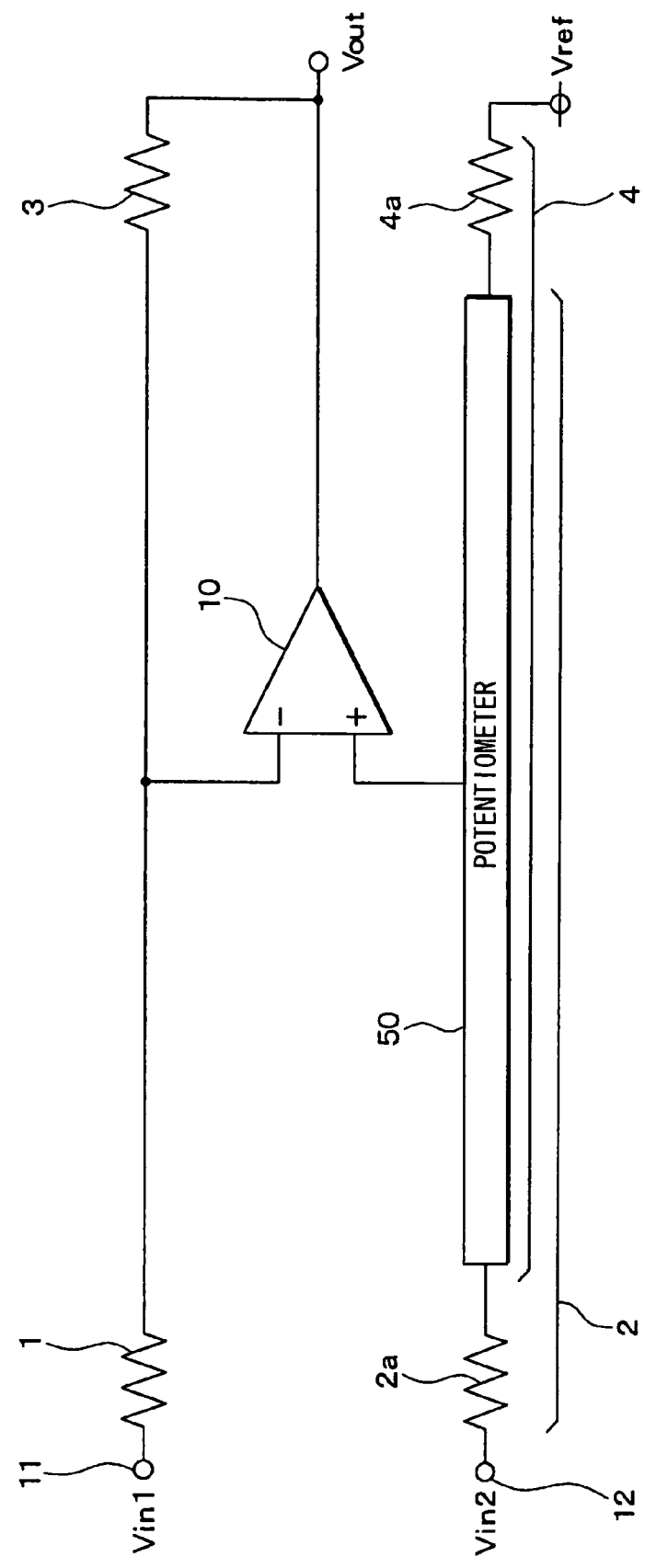
FIG. 20 is a circuit diagram illustrating a differential amplification circuit in accordance with a fifteenth embodiment.

As for the present embodiment, only a difference from the fourteenth embodiment will be described below. FIG. 20 is a circuit diagram of a differential amplification circuit in accordance with the present embodiment. As shown in the drawing, a potentiometer 50 is connected to the non-inverting input terminal of an operational amplifier 10. A configuration in which a second resistor 2 includes a fixed resistor 2a and the potentiometer 50, while a fourth resistor 4 includes a fixed resistor 4a and the potentiometer 50 can be used.

Sixteenth Embodiment

Figure 21:
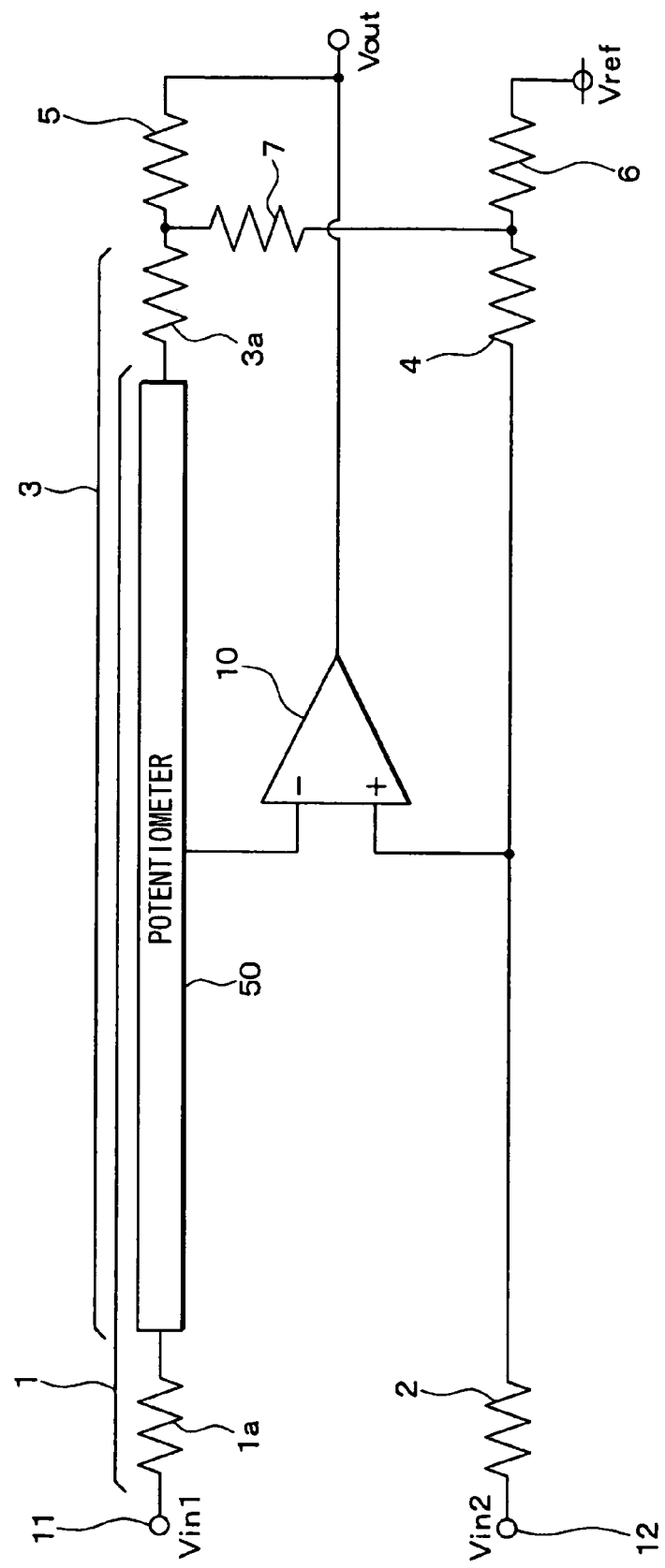
FIG. 21 is a circuit diagram illustrating a differential amplification circuit in accordance with a sixteenth embodiment.

As for the present embodiment, only a difference from the fourteenth embodiment will be described below. FIG. 21 is a circuit diagram of a differential amplification circuit in accordance with the present embodiment. As shown in the drawing, a potentiometer 50 may be connected to the inverting input terminal of an operational amplifier 10 in the circuit form shown in, for example, FIG. 11.

Seventeenth Embodiment

Figure 22:
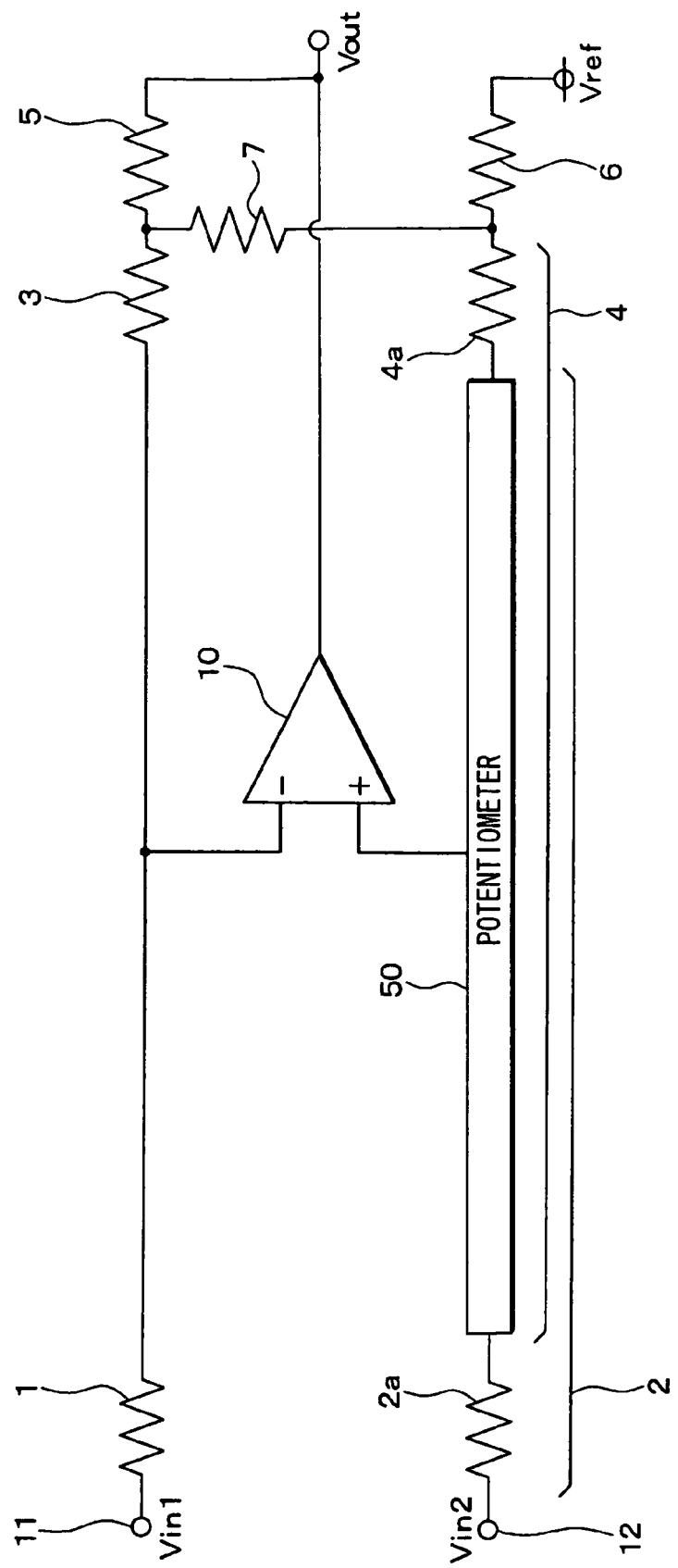
FIG. 22 is a circuit diagram illustrating a differential amplification circuit in accordance with a seventeenth embodiment.

As for the present embodiment, only a difference from the sixteenth embodiment will be described below. FIG. 22 is a circuit diagram of a differential amplification circuit in accordance with the present embodiment. As shown in the drawing, a potentiometer 50 may be connected to the non-inverting input terminal of an operational amplifier 10 in the circuit form shown in, for example, FIG. 11.

Other Embodiment

Figure 23A:
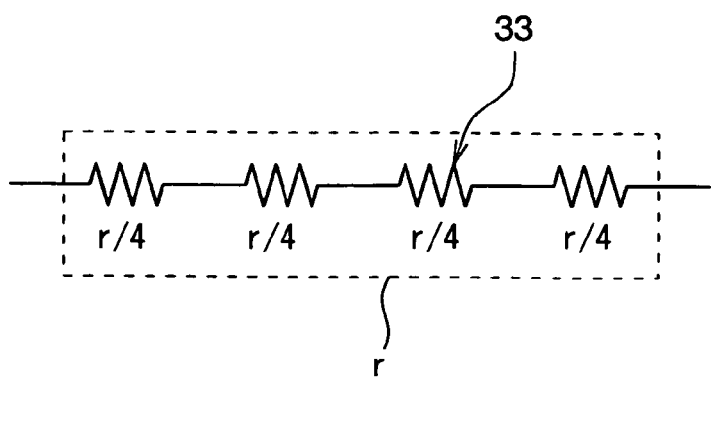
FIG. 23A and FIG. 23B are diagrams illustrating examples of multiple resistors constituting a digital variable resistor included in another embodiment.
Figure 23B:
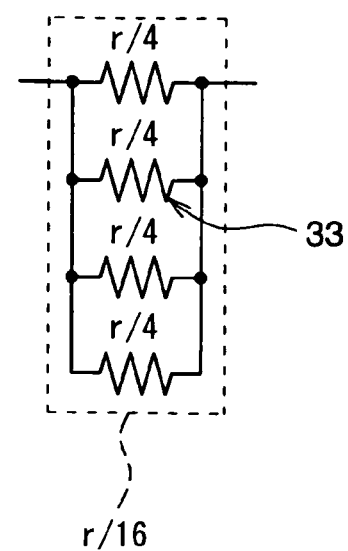

In the fifth embodiment, assuming that r denotes the resistance value shared by the resistors 33 in the first digital variable resistor 31, the resistance value shared by the resistors 33' in the second digital variable resistor 32 is r/16. Alternatively, the resistance value shared by the resistors 33 and 33' may be r/4. In the first digital variable resistor 31, four resistors 33 are, as shown in FIG. 23A, connected in series with one another. Thus, a resistor offering the resistance value of r is constructed. In the second digital variable resistor 32, four resistors 33' are, as shown in FIG. 23B, connected in parallel with one another. Thus, a resistor offering the resistance value of r/16 is constructed. Thus, by combining resistors offering the same resistance value, relative precision can be upgraded.

The foregoing idea may be applied to a sixth or a thirteenth embodiment in which the ratio of the resistance value of the multiple resistors 41 to that of the multiple resistors 41' is 16:1, whereby relative precision may be upgraded.

FIG. 24 show differential amplification circuits. When the differential amplification circuit is incorporated in a product such as a current sensor for actual use, the reference voltage Vref is fed from another circuit block incorporated in the product or from the ECU 62.

What is claimed is:
1. A differential amplification circuit comprising:
an operational amplifier having a potential at an output terminal thereof handled as an output potential;
a first resistor connected between a first input terminal brought to a first input potential and an inverting input terminal of the operational amplifier and the first resistor functioning as an input resistor;
a second resistor connected between a second input terminal brought to a second input potential and a non-inverting input terminal of the operational amplifier and the second resistor functioning as an input resistor;
a third resistor connected to the inverting input terminal of the operational amplifier;
a fourth resistor connected to the non-inverting input terminal of the operational amplifier;
a fifth resistor connected in series with the third resistor between the third resistor and the output terminal of the operational amplifier;
a sixth resistor connected in series with the fourth resistor between the fourth resistor and a reference potential point; and a seventh resistor connected between the junction of the third and fifth resistors and the junction of the fourth and sixth resistors, wherein:

in a state in which the first and second input terminals are brought to the same potential and the potentials at the first and second input terminals are set to a potential different from the reference potential, the resistance value of any of the first, second, third, fourth, fifth, and sixth resistors is adjusted so that the output potential and reference potential will be substantially equal to each other.

2. The differential amplification circuit according to claim 1, wherein:

assuming that R1 denotes the resistance value of the first resistor, R2 denotes the resistance value of the second resistor, R3 denotes the resistance value of the third resistor, R4 denotes the resistance value of the fourth resistor, R5 denotes the resistance value of the fifth resistor, and R6 denotes the resistance value of the sixth resistor, the resistance value of any of the first, second, third, fourth, fifth, and sixth resistors is adjusted so that the conditions of $R1 \cdot R4 - R2 \cdot R3 = 0$ and $R1 \cdot R6 - R2 \cdot R5 = 0$ are satisfied.

3. The differential amplification circuit according to claim 1, further comprising a resistance varying means for adjusting the resistance value of any of the first, second, third, fourth, fifth, and sixth resistors.

4. The differential amplification circuit according to claim 3, wherein the resistance varying means includes a plurality of resistors, portions of switch means that selectively strap ones of the plurality of resistors, and a selector that switches the portions of switch means according to an externally inputted digital signal.

5. The differential amplification circuit according to claim 3, wherein the resistance varying means includes a plurality of resistors and an analog multiplexer that determines a connection form of the plurality of resistors according to an externally inputted digital signal.

6. The differential amplification circuit according to claim 5, wherein portions of resistance varying means are connected to the inverting input terminal of the operational amplifier and the non-inverting input terminal thereof respectively, and the resolution of the resistance varying means connected to the inverting input terminal is different from the resolution of the resistance varying means connected to the non-inverting input terminal.

7. A means for performing a manufacturing adjustment of a differential amplification circuit comprising an operational amplifier having a potential at an output terminal thereof handled as an output potential, a first resistor connected between a first input terminal brought to a first input potential and an inverting input terminal of the operational amplifier and that functions as an input resistor, a second resistor that is connected between a second input terminal brought to a second input potential and a non-inverting input terminal of the operational amplifier the second resistor functioning as an input resistor, a third resistor connected to the inverting input terminal of the operational amplifier, a fourth resistor connected to the non-inverting input terminal of the operational amplifier, a fifth resistor connected in series with the third resistor between the third resistor and the output terminal of the operational amplifier, a sixth resistor connected in series with the fourth resistor between the fourth resistor and a reference potential point, and a seventh resistor connected between the junction of the third and fifth resistors and the junction of the fourth and sixth resistors, the means comprising:

means for setting the potentials at the first and second input terminals to a potential different from the reference potential in a state in which the first and second input terminals are brought to the same potential; and means for adjusting the resistance value of any of the first, second, third, fourth, fifth, and sixth resistors so that the output potential and reference potential will be substantially equal to each other.

8. The means for performing a manufacturing adjustment according to claim 7, wherein the means for adjusting the resistance value is further for adjusting the resistance value of any of the first, second, third, fourth, fifth, and sixth resistors so that the conditions of $R1 \cdot R4 - R2 \cdot R3 = 0$ and $R1 \cdot R6 - R2 \cdot R5 = 0$ will be satisfied, assuming that R1 denotes the resistance value of the first resistor, R2 denotes the resistance value of the second resistor, R3 denotes the resistance value of the third resistor, R4 denotes the resistance value of the fourth resistor, R5 denotes the resistance value of the fifth resistor, and R6 denotes the resistance value of the sixth resistor.

9. The means for performing a manufacturing adjustment according to claim 7, wherein the means for adjusting the resistance includes a plurality of resistors and an analog multiplexer that determines a connection form of the plurality of resistors according to an externally inputted digital signal.

10. The means for performing a manufacturing adjustment according to claim 7, wherein:

a first portion of the means for adjusting the resistance is connected to the inverting input terminal of the operational amplifier, the first portion of the means for adjusting controlled by a first digital signal of a first resolution; and a second portion of the means for adjusting the resistance is connected to the non-inverting input terminal of the operational amplifier, the second portion of the means for adjusting controlled by a second digital signal of a second resolution different from the first resolution.

* * * * *